US010859319B2

(12) United States Patent
Machida

(10) Patent No.: US 10,859,319 B2
(45) Date of Patent: Dec. 8, 2020

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 104 days.

(21) Appl. No.: 16/251,692

(22) Filed: Jan. 18, 2019

(65) Prior Publication Data

US 2019/0242653 A1    Aug. 8, 2019

(30) Foreign Application Priority Data

Feb. 5, 2018   (JP) .................................. 2018-018476

(51) Int. Cl.
*F28D 15/00* (2006.01)
*F28D 15/02* (2006.01)
*F28D 15/04* (2006.01)
*H05K 7/20* (2006.01)

(52) U.S. Cl.
CPC ....... *F28D 15/0266* (2013.01); *F28D 15/043* (2013.01); *F28D 15/046* (2013.01); *H05K 7/20336* (2013.01)

(58) Field of Classification Search
CPC .. F28D 15/0266; F28D 15/043; F28D 15/046; H05K 7/20336
USPC .................................................... 165/104.26
See application file for complete search history.

(56) References Cited

U.S. PATENT DOCUMENTS

| 6,843,308 B1 * | 1/2005 | Duval ................. F28D 15/0233 165/104.26 |
| 8,611,089 B2 | 12/2013 | Mizuta et al. |
| 10,082,340 B2 | 9/2018 | Hsieh |

(Continued)

FOREIGN PATENT DOCUMENTS

| EP | 3299758 | 3/2018 |
| JP | 2018-096669 | 6/2018 |

(Continued)

OTHER PUBLICATIONS

Extended European Search Report dated Jul. 8, 2019 issued with respect to the corresponding European Patent Application No. 19154279.4.

(Continued)

*Primary Examiner* — Claire E Rojohn, III
(74) *Attorney, Agent, or Firm* — IPUSA, PLLC

(57) ABSTRACT

A loop heat pipe includes an evaporator to vaporize a working fluid, a condenser to liquefy the working fluid, a liquid pipe to connect the evaporator and the condenser, a porous body provided inside a flow passage in which the working fluid or vapor thereof flows, and a vapor pipe to connect the evaporator and the condenser and form a loop-shaped passage together with the liquid pipe. The porous body includes a metal layer including a first bottomed hole that caves in from a first surface thereof, a second bottomed hole that caves in from a second surface thereof, opposite to the first surface, and a pore formed by and partially communicating the first and second bottomed holes. An inner wall surface of each of the first and second bottomed holes formed in the porous body has a concave shape formed by a curved surface.

9 Claims, 23 Drawing Sheets

(56) References Cited

U.S. PATENT DOCUMENTS

| | | | |
|---|---|---|---|
| 2002/0135979 A1* | 9/2002 | Estes | H01L 23/427 |
| | | | 361/688 |
| 2007/0056711 A1* | 3/2007 | Ohsawa | F28D 15/0233 |
| | | | 165/104.21 |
| 2008/0189948 A1 | 8/2008 | Schulz-Harder | |
| 2010/0044014 A1* | 2/2010 | Ho | F28D 1/035 |
| | | | 165/104.26 |
| 2012/0106084 A1* | 5/2012 | Mizuta | F28D 15/046 |
| | | | 361/700 |
| 2013/0269913 A1* | 10/2013 | Ueda | F28D 15/04 |
| | | | 165/104.26 |
| 2015/0119111 A1* | 4/2015 | Honmura | H04M 1/026 |
| | | | 455/566 |
| 2016/0259383 A1* | 9/2016 | Shioga | G06F 1/203 |
| 2016/0290733 A1* | 10/2016 | Noishiki | F28F 9/0204 |
| 2018/0142960 A1* | 5/2018 | Kurashima | H01L 23/427 |
| 2018/0164043 A1* | 6/2018 | Kurashima | F28D 15/0233 |
| 2019/0110356 A1* | 4/2019 | Silvano De Sousa | |
| | | | H05K 3/4038 |
| 2019/0242652 A1 | 8/2019 | Machida | |
| 2019/0285354 A1* | 9/2019 | Machida | H01L 23/3736 |
| 2019/0293362 A1* | 9/2019 | Machida | H01L 23/427 |
| 2020/0049417 A1* | 2/2020 | Machida | F28D 15/0233 |
| 2020/0049419 A1* | 2/2020 | Machida | H05K 7/20336 |
| 2020/0064077 A1* | 2/2020 | Machida | F28D 15/0233 |
| 2020/0096261 A1* | 3/2020 | Tanaka | F28D 15/043 |
| 2020/0124353 A1* | 4/2020 | Machida | F28D 15/043 |
| 2020/0200485 A1* | 6/2020 | Machida | F28F 3/086 |

FOREIGN PATENT DOCUMENTS

| | | |
|---|---|---|
| JP | 6400240 | 10/2018 |
| WO | 2015/087451 | 6/2015 |

OTHER PUBLICATIONS

Extended European Search Report dated Jul. 12, 2019 issued with respect to the related European Patent Application No. 19152223.4.

Office Action dated May 7, 2020 issued with respect to the related U.S. Appl. No. 16/243,476.

Office Action dated Sep. 24, 2020 issued with respect to the related U.S. Appl. No. 16/243,476.

* cited by examiner

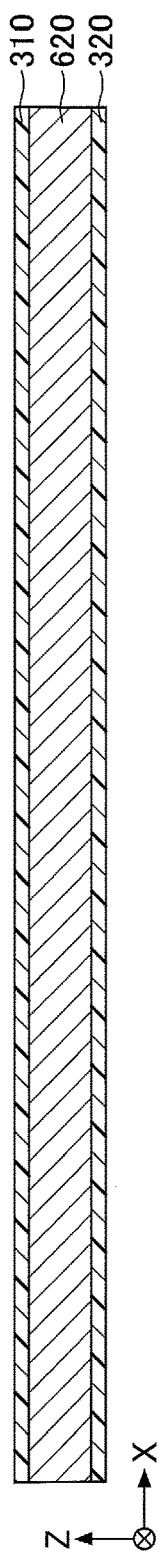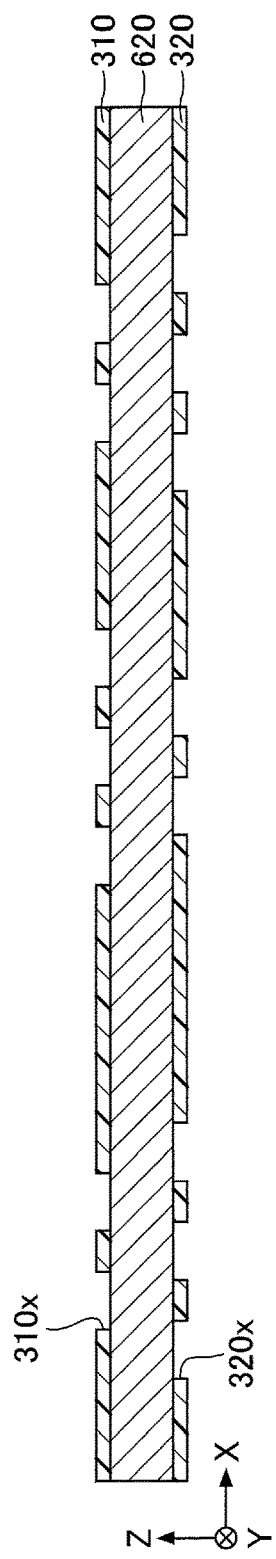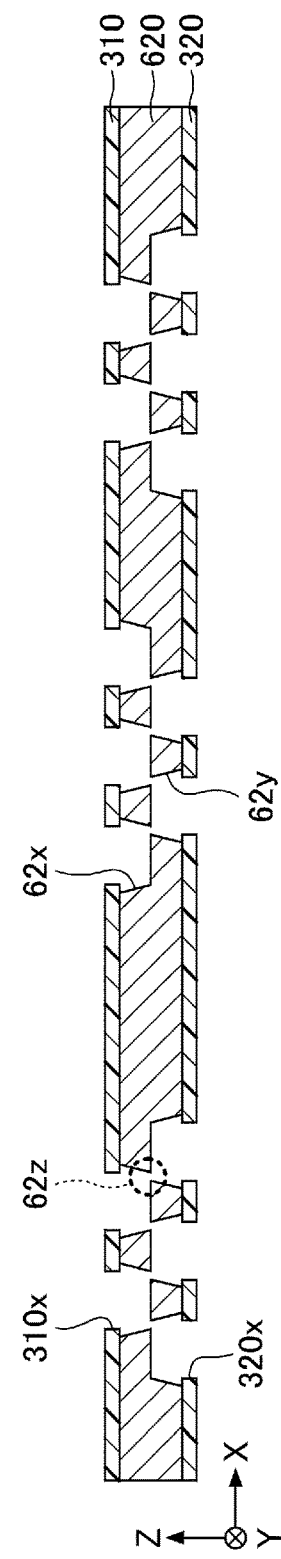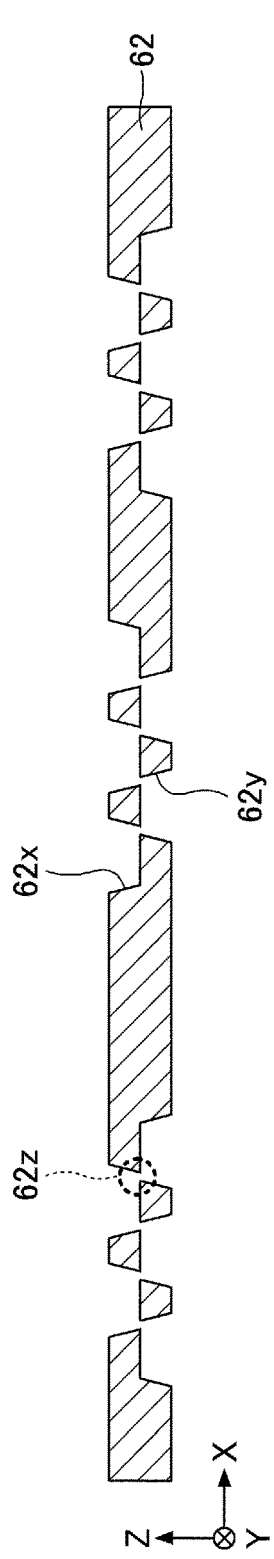

LOOP HEAT PIPE

CROSS-REFERENCE TO RELATED APPLICATION

This application is based upon and claims priority to Japanese Patent Application No. 2018-018476, filed on Feb. 5, 2018, the entire contents of which are incorporated herein by reference.

FIELD

Certain aspects of the embodiments discussed herein are related to a loop heat pipe, and a method of manufacturing the loop heat pipe.

BACKGROUND

The heat pipe is a known device for cooling a heat generating component, such as a CPU (Central Processing Unit) or the like, mounted in an electronic apparatus. The heat pipe is a device that transfers heat by utilizing a phase change of a working fluid.

The loop heat pipe is an example of the heat pipe, and includes an evaporator that vaporizes the working fluid by the heat from the heat generating component to generate vapor, a condenser that cools the vapor of the working fluid to liquefy the vapor, and a vapor pipe and a liquid pipe that connect the evaporator and the condenser, to form a loop-shaped passage. In the loop heat pipe, the working fluid flows through the loop-shaped passage in one direction.

In addition, a porous body is provided inside the evaporator and the liquid pipe of the loop heat pipe. The working fluid inside the liquid pipe is guided to the evaporator by a capillary force generated by the porous body, to reduce back-streaming of the vapor from the evaporator to the liquid pipe. Pores are formed in the porous body. The pores are formed by stacking a plurality of metal layers having through-holes that are arranged at partially overlapping positions. An example of such a loop heat pipe is proposed in International Publication Pamphlet No. WO2015/087451, for example.

However, it is difficult to stack the plurality of metal layers having the through-holes so that the through-holes partially overlap each other, because of the following reasons. First, a positional error is generated when the metal layers are stacked. Second, a positional error is generated due to expansion and contraction of the plurality of metal layers, in a case in which a heat treatment is performed when stacking the plurality of metal layers. Third, positions of the through-holes, formed in the metal layers, become inconsistent.

When the positional error described above occurs, pores having a constant size cannot be formed in the porous body, to decrease the capillary force generated by the pores. As a result, there are cases in which the effect of reducing the back-streaming of the vapor from the evaporator to the liquid pipe by the capillary force generated by the pores cannot be obtained to a sufficient extent.

SUMMARY

Accordingly, it is an object in one aspect of the embodiments to provide a loop heat pipe having a porous body that can improve, that is, increase, a capillary force generated by pores of the porous body.

According to one aspect of the embodiments, a loop heat pipe includes an evaporator configured to vaporize a working fluid; a condenser configured to liquefy the working fluid; a liquid pipe configured to connect the evaporator and the condenser; a porous body provided inside a flow passage in which the working fluid or vapor of the working fluid that is vaporized flows; and a vapor pipe configured to connect the evaporator and the condenser, to form a loop-shaped passage together with the liquid pipe, wherein the porous body includes a first metal layer, wherein the first metal layer includes a first bottomed hole that caves in from a first surface of the first metal layer, a second bottomed hole that caves in from a second surface of the first metal layer, opposite to the first surface, and a pore formed by the first bottomed hole and the second bottomed hole and partially communicating the first bottomed hole and the second bottomed hole, and wherein an inner wall surface of each of the first and second bottomed holes formed in the porous body has a concave shape formed by a curved surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 6A, FIG. 6B, FIG. 6C, and FIG. 6D are diagrams (part 1) illustrating examples of manufacturing stages of the loop heat pipe in the first embodiment;

DESCRIPTION OF EMBODIMENTS

Figure 1:
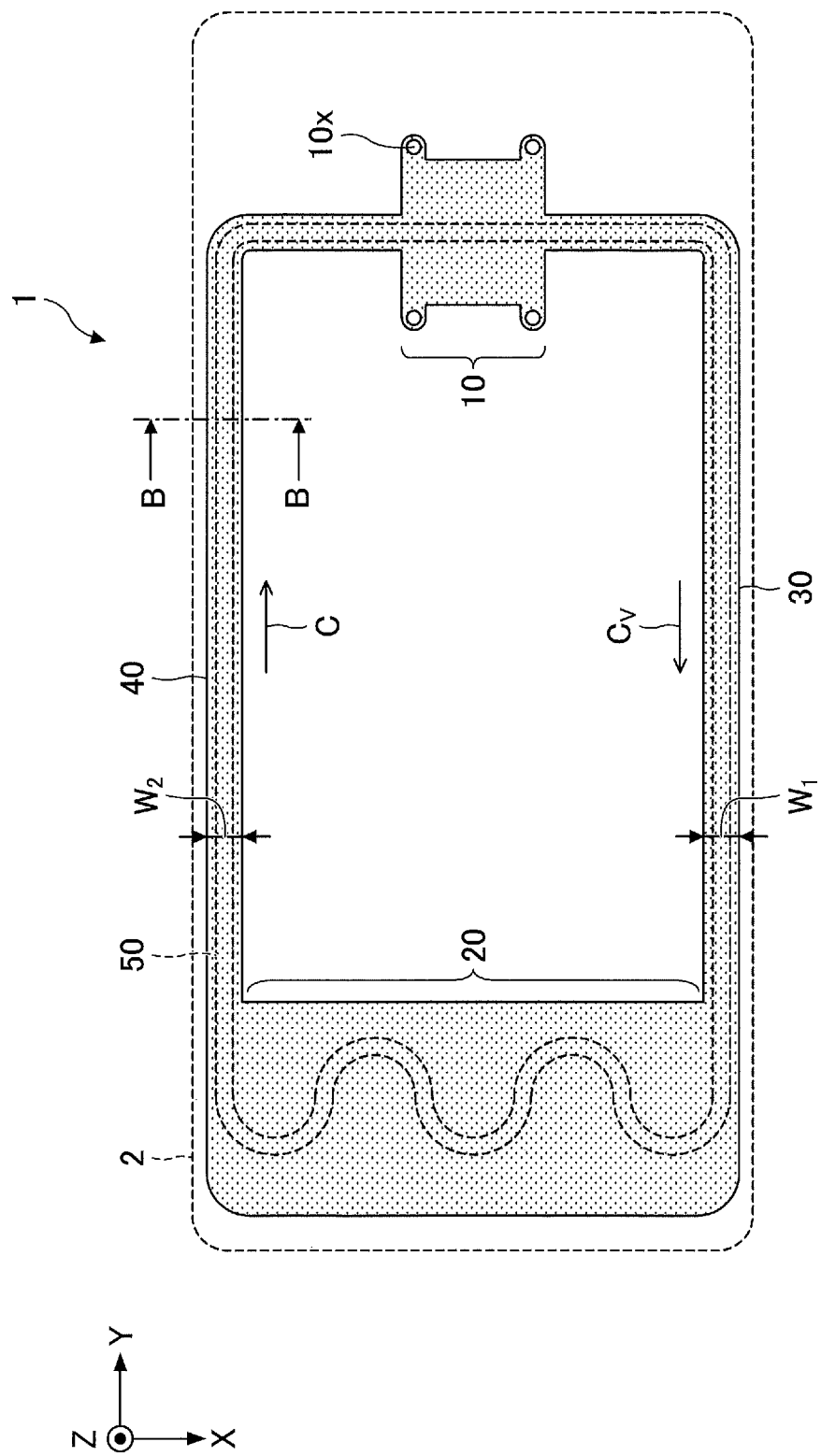
FIG. 1 is a plan view schematically illustrating an example of a loop heat pipe in a first embodiment.

Preferred embodiments of the present invention will be described with reference to the accompanying drawings. In the drawings, those parts that are the same are designated by the same reference numerals, and a repeated description of the same parts may be omitted.

A description will now be given of a loop heat pipe and a method of manufacturing the loop heat pipe in each embodiment according to the present invention.

First Embodiment

[Structure of Loop Heat Pipe in First Embodiment]

First, the structure of the loop heat pipe in a first embodiment will be described. FIG. 1 is a plan view schematically illustrating an example of the loop heat pipe in the first embodiment.

As illustrated in FIG. 1, a loop heat pipe 1 includes an evaporator 10, a condenser 20, a vapor pipe 30, and a liquid pipe 40. The loop heat pipe 1 may be accommodated within a portable or mobile electronic apparatus 2, such as a smartphone, a tablet terminal, or the like, for example.

In the loop heat pipe 1, the evaporator 10 has a function to vaporize a working fluid C and generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop-shaped passage (or route) 50 in which the working liquid C or the vapor Cv flows.

Figure 2:
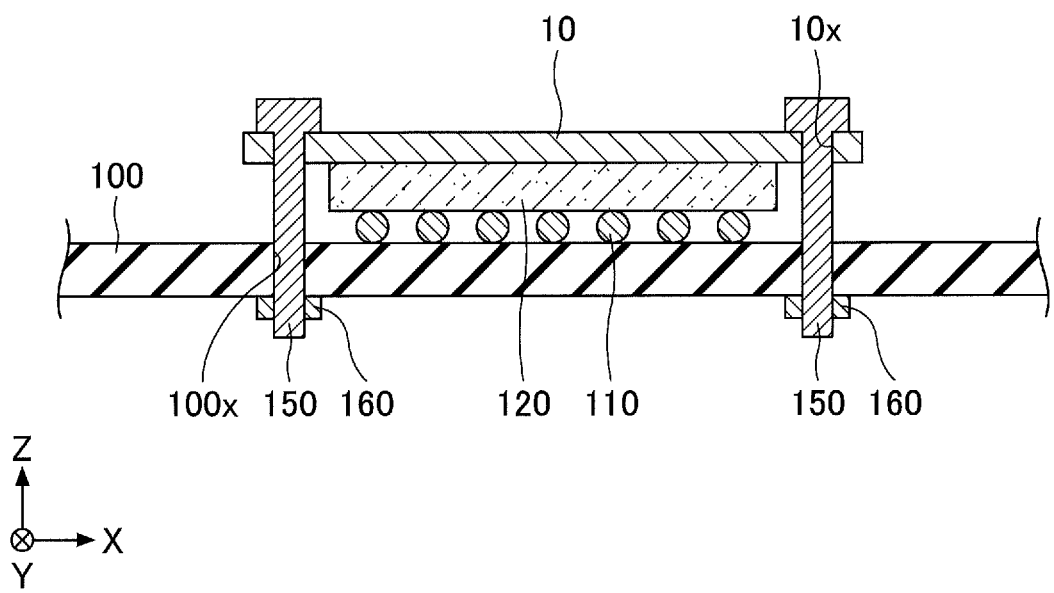
FIG. 2 is a cross sectional view of an evaporator and a periphery thereof of the loop heat pipe in the first embodiment.

FIG. 2 is a cross sectional view of the evaporator and a periphery thereof of the loop heat pipe in the first embodiment. As illustrated in FIG. 1 and FIG. 2, the evaporator 10 includes 4 through-holes 10x, for example. A bolt 150 is inserted into each through-hole 10x of the evaporator 10 and a corresponding through-hole 100x formed in a circuit board 100, and a tip of each bolt 150 is fastened by a nut 160 at a lower surface side of the circuit board 100 in FIG. 2, to fix the evaporator 10 on the circuit board 100.

A heat generating component 120, such as a CPU or the like, for example, is mounted on the circuit board 100 via bumps 110. An upper surface of the heat generating component 120 is bonded to a lower surface of the evaporator 10. The working fluid C inside the evaporator 10 is vaporized by the heat generated from the heat generating component 120, to generate the vapor Cv.

As illustrated in FIG. 1, the vapor Cv generated from the evaporator 10 passes through the vapor pipe 30 and is guided to the condenser 20, to be liquefied by the condenser 20. Hence, the heat generated from the heat generating component 120 is transferred to the condenser 20, to reduce a temperature rise of the heat generating component 120. The working fluid C, liquefied by the condenser 20, passes through the liquid pipe 40 and is guided to the evaporator 10. A width $W_1$ of the vapor pipe 30 may be approximately 8 mm, for example. In addition, a width $W_2$ of the liquid pipe 40 may be approximately 6 mm, for example.

The working fluid C is not limited to a particular type of fluid. From a viewpoint of efficiently cooling the heat generating component 120 by latent heat of vaporization, a fluid with a high vapor pressure and a large latent heat of vaporization is preferably used as the working fluid C. Examples of such a fluid, preferably used as the working fluid C, include ammonia, water, fluorocarbon, alcohol, and acetone, for example.

The evaporator 10, the condenser 20, the vapor pipe 30, and the liquid pipe 40 may have a structure that is formed by successively stacking a plurality of metal layers. The metal layers are copper layers having a high thermal conductivity, for example, and the metal layers are directly bonded to each other by solid-phase (or solid-state) bonding or the like. Each of the metal layers may have a thickness of approximately 50 μm to approximately 200 μm, for example.

Of course, the metal layers are not limited to the copper layers, and may be stainless steel layers, aluminum layers, magnesium alloy layers, or the like, for example. In addition, the number of metal layers that are stacked is not limited to a particular number.

Figure 3:
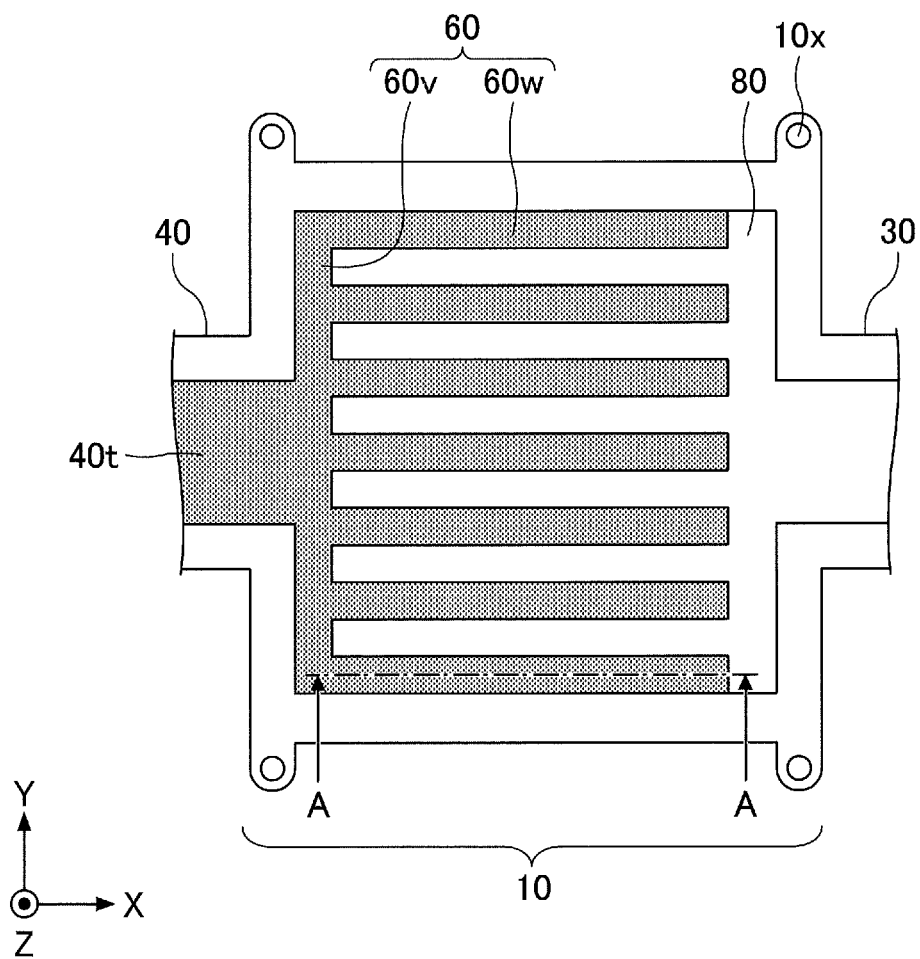
FIG. 3 is a plan view of the evaporator and the periphery thereof of the loop heat pipe in the first embodiment.

FIG. 3 is a plan view of the evaporator and the periphery thereof of the loop heat pipe in the first embodiment. FIG. 3 illustrates a planar shape of a porous body 60 inside the evaporator 10, and thus, the illustration of a metal layer (a metal layer 61 illustrated in FIG. 4) at one outermost layer of the porous body 60 will be omitted. In addition, an X-direction in FIG. 3 indicates a lengthwise direction from the liquid pipe 40 toward the vapor pipe 30, and a Y-direction in FIG. 3 indicates a lengthwise direction that is perpendicular to the lengthwise direction from the liquid pipe 40 toward the vapor pipe 30.

The porous body 60 inside the evaporator 10, illustrated in FIG. 3, includes a connecting part 60v and protruding parts 60w.

In the plan view, the connecting part 60v is provided on the side closest to the liquid pipe 40 along the X-direction (the side where the liquid pipe 40 connects to the evaporator 10), and extends in the Y-direction. A part of a surface of the connecting part 60v, on the side of the liquid pipe 40, makes contact with a pipe wall of the evaporator 10. A remaining part of the surface of the connecting part 60v, on the side of the liquid pipe 40, connects to a porous body 40t provided inside a flow passage of, the liquid pipe 40. In addition, a part of a surface of the connecting part 60v, on the side of the vapor pipe 30, connects to the protruding parts 60w. A remaining part of the surface of the connecting part 60v, on the side of the vapor pipe 30, makes contact with a space 80.

In the plan view, the protruding parts 60w protrude from the connecting part 60v toward the vapor pipe 30.

The protruding parts 60w are arranged at predetermined intervals along the Y-direction. End parts of the protruding parts 60w on the side of the vapor pipe 30 are separated from the pipe wall of the evaporator 10. In addition, the end parts of the protruding parts 60w on the side of the vapor pipe 30 are not connected to each other. On the other hand, end parts of the protruding parts 60w on the side of the liquid pipe 40 are connected via the connecting part 60v. In other words, in the plan view, the porous body 60 inside the evaporator 10 is formed to a comb shape made up of the connecting part 60v and the plurality of protruding parts 60w.

The space 80 is formed inside the evaporator 10 in a region where the porous body 60 is not provided. The space 80 communicates to the flow passage of the vapor pipe 30.

The working fluid C from the liquid pipe 40 is guided to the evaporator 10, and permeates into the porous body 60. The working fluid C permeated into the porous body 60 inside the evaporator 10 is vaporized by the heat generated from the heat generating component 120, to generate the vapor Cv. This vapor Cv passes through the space 80 inside the evaporator 10 and flows to the vapor pipe 30. The example illustrated in FIG. 3 includes 7 protruding parts 60w (comb teeth), however, the number of protruding parts 60w (comb teeth) may be appropriately determined. The larger the contact area between the protruding parts 60w and the space 80 becomes, the easier the vaporization of the working fluid C becomes, to enable reduction of pressure drop or pressure loss. A more detailed description will now be given of the porous body 60.

Figure 4:
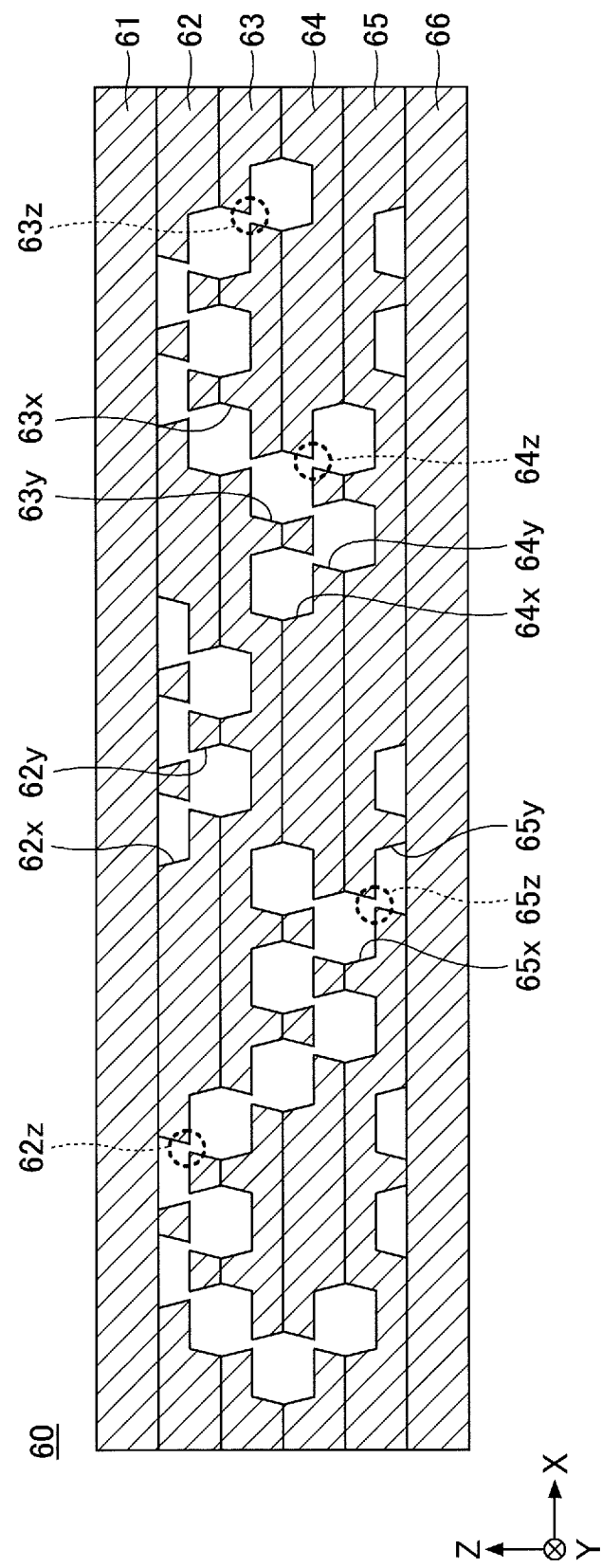
FIG. 4 is a cross sectional view (part 1) illustrating an example of a porous body provided inside the evaporator.

FIG. 4 is a cross sectional view (part 1) illustrating an example of the porous body 60 provided inside the evaporator 10. FIG. 4 illustrates a cross section along a line A-A in FIG. 3. However, although the illustration of the one outermost layer (uppermost layer) of the porous body 60 is omitted in FIG. 3, the cross section illustrated in FIG. 4 includes the metal layer 61 that is the one outermost layer (uppermost layer) of the porous body 60.

FIG. 5A, FIG. 5B, FIG. 5C, and FIG. 5D are plan views (part 1) illustrating examples of arrangements of bottomed holes in each of second through fifth metal layers. In FIG. 5A through FIG. 5D, a part indicated by a line A-A corresponds to the cross section illustrated in FIG. 4. Although FIG. 3 illustrates the line A-A in a simplified manner as a straight line, the line A-A is actually as illustrated in FIG. 5A through FIG. 5D.

The porous body 60 may have a structure that is formed by successively stacking 6 metal layers 61 through 66, for example. The metal layers 61 through 66 are copper layers having a high thermal conductivity, for example, and the metal layers 61 through 66 are directly bonded to each other by solid-phase bonding or the like. Each of the metal layers 61 through 66 may have a thickness of approximately 50 μm to approximately 200 μm, for example. Of course, the metal layers 61 through 66 are not limited to the copper layers, and may be stainless steel layers, aluminum layers, magnesium alloy layers, or the like, for example. In addition, the number of metal layers that are stacked is not limited to 6, and the number of metal layers that are stacked may be 5 or less, or 7 or more.

In FIG. 4 and FIG. 5A through FIG. 5D and subsequent figures, the XYZ coordinate system is used to represent directions. The metal layers 61 through 66 are stacked in a Z-direction. An arbitrary direction on a plane perpendicular to the Z-direction is indicated as the X-direction, and a direction on the plane perpendicular to the Z-direction and perpendicular to the X-direction is indicated as the Y-direction.

Figure 5A:
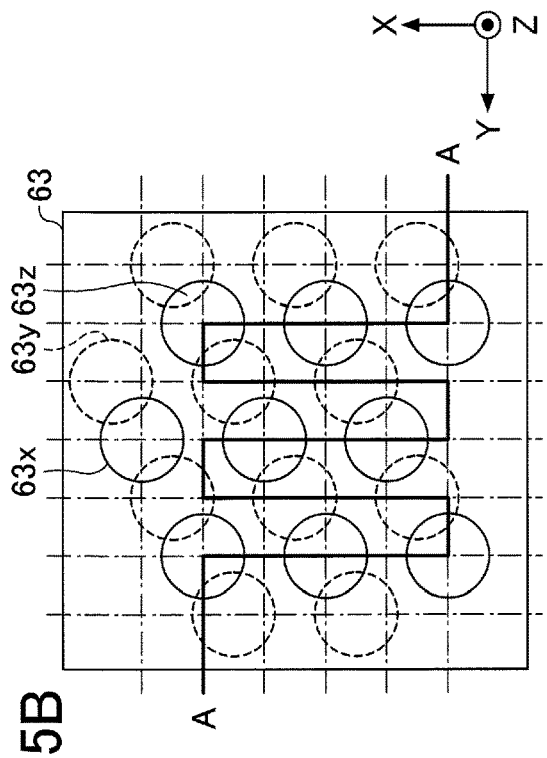
FIG. 5A, FIG. 5B, FIG. 5C, and FIG. 5D are plan views (part 1) illustrating examples of arrangements of bottomed holes in each of second through fifth metal layers.

In the porous body 60, the first metal layer (one outermost layer) 61 and the sixth metal layer (the other outermost layer) 66 include no holes or grooves. On the other hand, as illustrated in FIG. 4 and FIG. 5A, the second metal layer 62 includes a plurality of bottomed holes 62x and a plurality of bottomed holes 62y. The bottomed holes 62x cave in from an upper surface of the second metal layer 62 to an approximate center part along a thickness thereof in the Z-direction (hereinafter also referred to as a "thickness direction"). The bottomed holes 62y cave in from a lower surface of the second metal layer 62 to the approximate center part along the thickness direction.

In the plan view, the bottomed holes 62x and the bottomed holes 62y are alternately arranged along the X-direction. In addition, in the plan view, the bottomed holes 62x and the bottomed holes 62y are alternately arranged along the Y-direction. The bottomed holes 62x and the bottomed holes 62y that are alternately arranged along the X-direction partially overlap in the plan view, and the partially overlapping parts of the bottomed holes 62x and the bottomed holes 62y communicate with each other to form pores 62z. In other words, the partially overlapping part of the bottomed hole 62x and the partially overlapping part of the bottomed hole 62y communicate with each other to form the pore 62z. The bottomed holes 62x and the bottomed holes 62y that are alternately arranged along the Y-direction are arranged at predetermined intervals, and do not overlap in the plan view. For this reason, the bottomed holes 62x and the bottomed holes 62y that are alternately arranged along the Y-direction do not form pores.

The bottomed holes 62x and 62y may have a circular shape having a diameter of approximately 100 μm to approximately 300 μm, for example. However, the bottomed holes 62x and 62y may have an arbitrary shape, such as an oval shape, a polygonal shape, or the like. A depth of the bottomed holes 62x and 62y may be approximately one-half of the thickness of the second metal layer 62. A length $L_1$ of the interval between adjacent bottomed holes 62x may be approximately 100 μm to approximately 400 μm, for example. A length $L_2$ of the interval between adjacent bottomed holes 62y may be approximately 100 μm to approximately 400 μm, for example.

Inner walls of the bottomed holes 62x and 62y may have a tapered shape that widens from a bottom surface side towards an opening side. However, the inner walls of the bottomed holes 62x and 62y are not limited to such a tapered shape. For example, the inner walls of the bottomed holes 62x and 62y may be perpendicular with respect to the bottom surface. A width $W_3$ of the pore 62z along a lateral direction thereof may be approximately 10 μm to approximately 50 μm, for example. In addition, a width $W_4$ of the pore 62z along a longitudinal direction thereof may be approximately 50 μm to approximately 150 μm, for example.

Figure 5B:
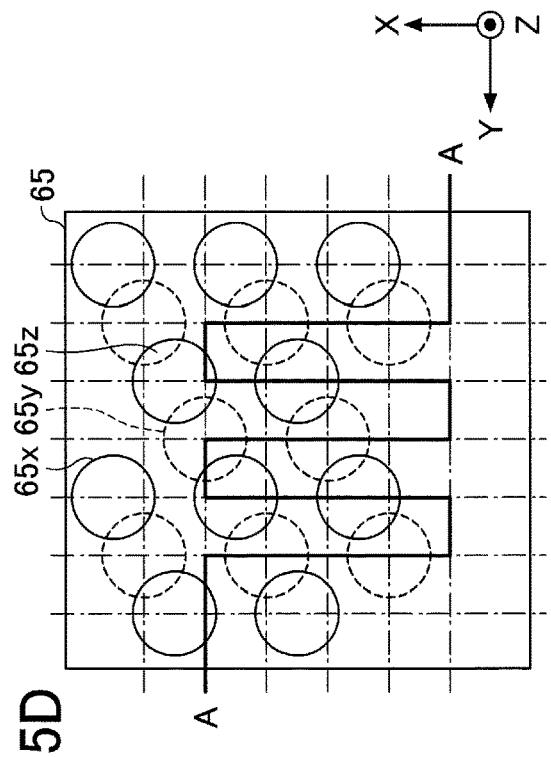

As illustrated in FIG. 4 and FIG. 5B, the third metal layer 63 includes a plurality of bottomed holes 63x and a plurality of bottomed holes 63y. The bottomed holes 63x cave in from an upper surface of the third metal layer 63 to an approximate center part along a thickness direction thereof. The bottomed holes 63y cave in from a lower surface of the third metal layer 63 to the approximate center part along the thickness direction.

The third metal layer 63 includes first rows in which only the bottomed holes 63x are arranged along the X-direction, and second rows in which only the bottomed holes 63y are arranged along the Y-direction. The first rows and the second rows are alternately arranged along the Y-direction. Among the rows that are alternately arranged along the Y-direction, the bottomed holes 63x and the bottomed holes 63y of the adjacent rows partially overlap in the plan view, and the partially overlapping parts of the bottomed holes 63x and the bottomed holes 63y communicate with each other to form pores 63z. In other words, the partially overlapping part of the bottomed hole 63x and the partially overlapping part of the bottomed hole 63y communicate with each other to form the pore 63z.

However, center positions of the adjacent bottomed holes 63x and 63y that form the pore 63z are offset along the X-direction. In other words, the adjacent bottomed holes 63x and 63y that form the pores 63z are alternately arranged along a direction that is oblique with respect to both the X-direction and the Y-direction. The size, shape, or the like of the bottomed holes 63x and 63y, and the pores 63z may be similar to the size, shape, or the like of the bottomed holes 62x and 62y, and the pores 62z.

The bottomed holes 62y of the second metal layer 62 and the bottomed holes 63x of the third metal layer 63 are formed at overlapping positions in the plan view. For this reason, no pores are formed at an interface between the second metal layer 62 and the third metal layer 63.

Figure 5C:
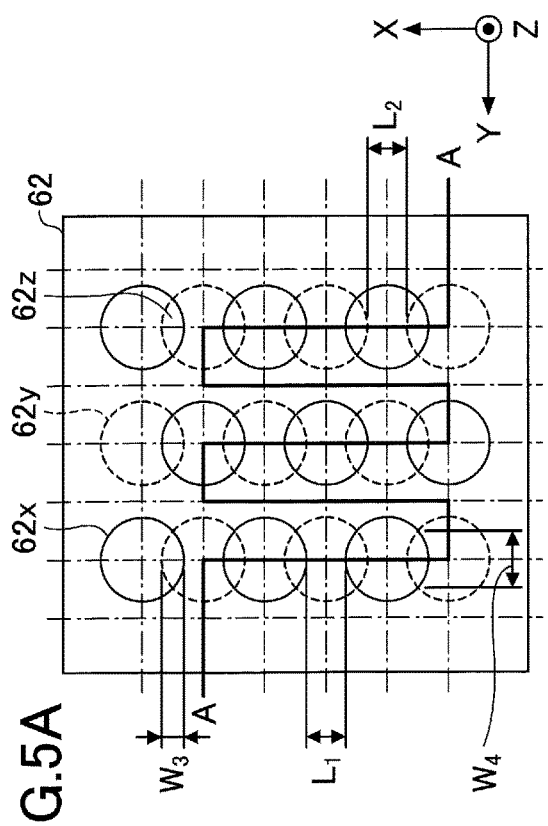

As illustrated in FIG. 4 and FIG. 5C, the fourth metal layer 64 includes a plurality of bottomed holes 64x and a plurality of bottomed holes 64y. The bottomed holes 64x cave in from an upper surface of the fourth metal layer 64 to an approximate center part along a thickness direction thereof. The bottomed holes 64y cave in from a lower surface of the fourth metal layer 64 to the approximate center part along the thickness direction.

In the plan view, the bottomed holes 64x and the bottomed holes 64y are alternately arranged along the X-direction. In addition, in the plan view, the bottomed holes 64x and the bottomed holes 64y are alternately arranged along the Y-direction. The bottomed holes 64x and the bottomed holes 64y that are alternately arranged along the X-direction partially overlap in the plan view, and the partially overlapping parts of the bottomed holes 64x and the bottomed holes 64y communicate with each other to form pores 64z. In other words, the partially overlapping part of the bottomed hole 64x and the partially overlapping part of the bottomed hole 64y communicate with each other to form the pore 64z. The bottomed holes 64x and the bottomed holes 64y that are alternately arranged along the Y-direction are arranged at predetermined intervals, and do not overlap in the plan view. For this reason, the bottomed holes 64x and the bottomed holes 64y that are alternately arranged along the Y-direction do not form pores. The size, shape, or the like of the bottomed holes 64x and 64y, and the pores 64z may be similar to the size, shape, or the like of the bottomed holes 62x and 62y, and the pores 62z.

The bottomed holes 63y of the third metal layer 63 and the bottomed holes 64x of the fourth metal layer 64 are formed at overlapping positions in the plan view. For this reason, no pores are formed at an interface between the third metal layer 63 and the fourth metal layer 64.

Figure 5D:
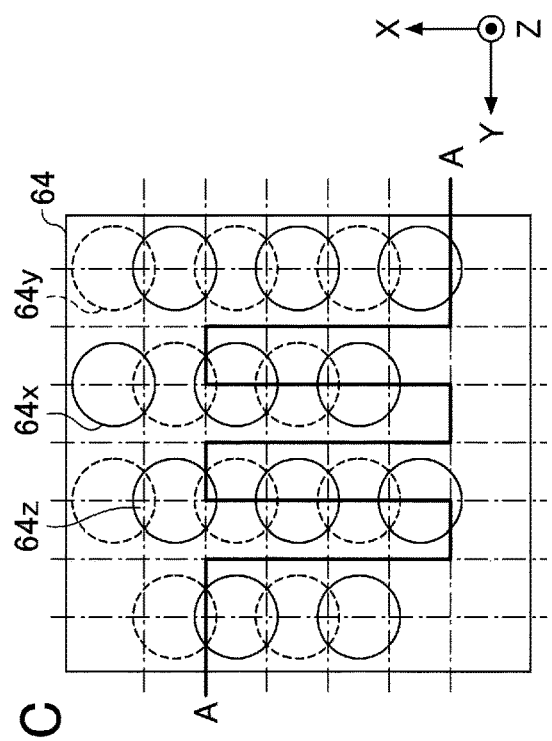

As illustrated in FIG. 4 and FIG. 5D, the fifth metal layer 65 includes a plurality of bottomed holes 65x and a plurality of bottomed holes 65y. The bottomed holes 65x cave in from an upper surface of the fifth metal layer 65 to an approximate center part along a thickness direction thereof. The bottomed holes 65y cave in from a lower surface of the fifth metal layer 65 to the approximate center part along the thickness direction.

The fifth metal layer 65 includes first rows in which only the bottomed holes 65x are arranged along the X-direction, and second rows in which only the bottomed holes 65y are arranged along the Y-direction. The first rows and the second rows are alternately arranged along the Y-direction. Among the rows that are alternately arranged along the Y-direction, the bottomed holes 65x and the bottomed holes 65y of the adjacent rows partially overlap in the plan view, and the partially overlapping parts of the bottomed holes 65x and the bottomed holes 65y communicate with each other to form pores 65z. In other words, the partially overlapping part of the bottomed hole 63x and the partially overlapping part of the bottomed hole 63y communicate with each other to form the pore 63z.

However, center positions of the adjacent bottomed holes 65x and 65y that form the pore 65z are offset along the X-direction. In other words, the adjacent bottomed holes 65x and 65y that form the pores 65z are alternately arranged along a direction that is oblique with respect to both the X-direction and the Y-direction. The size, shape, or the like of the bottomed holes 65x and 65y, and the pores 65z may be similar to the size, shape, or the like of the bottomed holes 62x and 62y, and the pores 62z.

The bottomed holes 64y of the fourth metal layer 64 and the bottomed holes 65x of the fifth metal layer 65 are formed at overlapping positions in the plan view. For this reason, no pores are formed at an interface between the fourth metal layer 64 and the fifth metal layer 65.

The pores formed in each of the metal layers communicate with each other, and these mutually communicating pores spread three-dimensionally within the porous body 60. Hence, the working fluid C spreads three-dimensionally within these mutually communicating pores due to the capillary force.

Because the porous body 60 is provided inside the evaporator 10, the working fluid C in the liquid phase permeates into the part of the porous body 60 inside the evaporator 10 and adjacent to the liquid pipe 40. In this state, the capillary force from the porous body 60, that acts on the working fluid C, becomes a pumping force that circulates the working fluid C inside the loop heat pipe 1.

Further, because this capillary force acts against the vapor Cv inside the evaporator 10, it is possible to reduce backstreaming of the vapor Cv from the evaporator 10 to the liquid pipe 40.

An inlet (not illustrated) is provided in the liquid pipe 40, and the working fluid C is filled into the liquid pipe 40 through the inlet. After filling the working fluid C into the liquid pipe 40, the inlet is sealed by a sealing member (not illustrated), to maintain a hermetically sealed state of the loop heat pipe 1.

[Method of Manufacturing Loop Heat Pipe in First Embodiment]

Figure 7A:
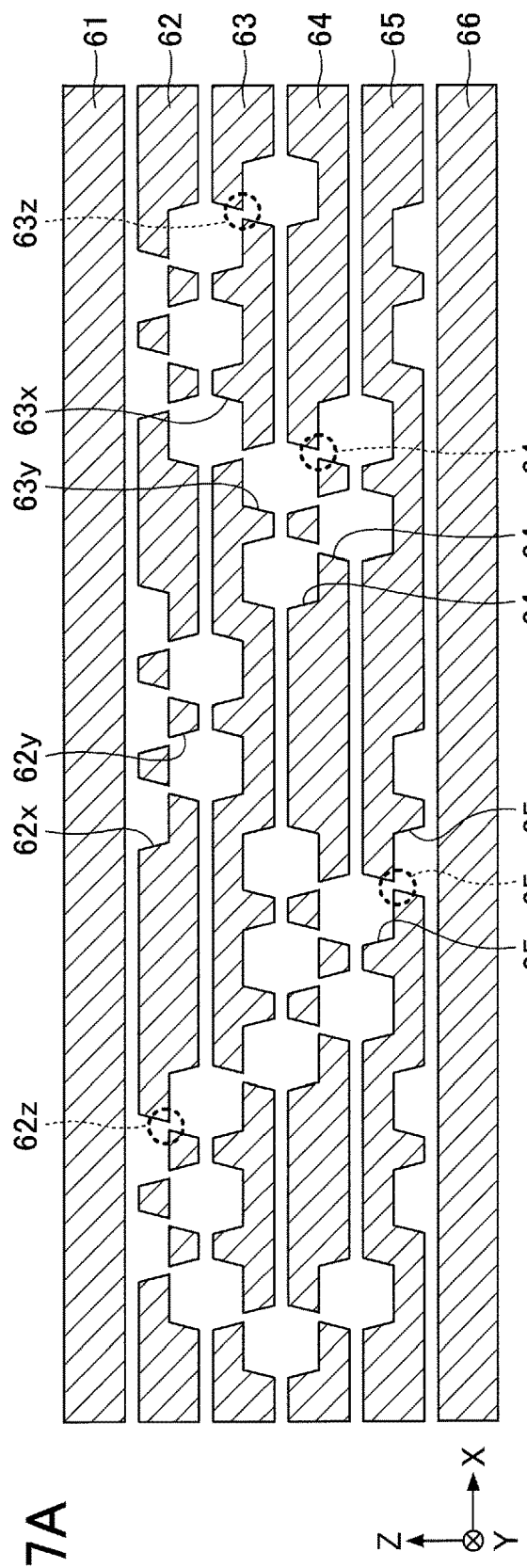
FIG. 7A and FIG. 7B are diagrams (part 2) illustrating examples of the manufacturing stages of the loop heat pipe in the first embodiment.
Figure 7B:
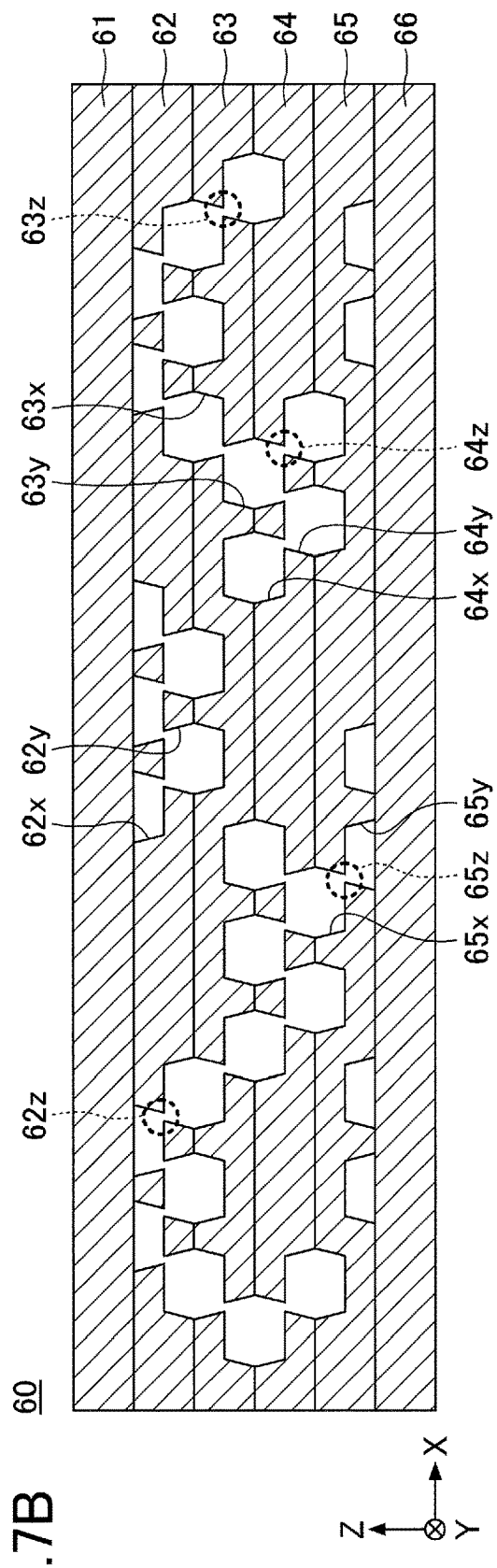

Next, a method of manufacturing the loop heat pipe in the first embodiment will be described, by mainly referring to manufacturing stages of the porous body. FIG. 6A, FIG. 6B, FIG. 6C, and FIG. 6D are diagrams (part 1) illustrating examples of manufacturing stages of the loop heat pipe in the first embodiment, and FIG. 7A and FIG. 7B are diagrams (part 2) illustrating examples of the manufacturing stages of the loop heat pipe in the first embodiment. FIG. 6A through FIG. 6D, FIG. 7A, and FIG. 7B correspond to the cross section illustrated in FIG. 4.

First, in the manufacturing stage illustrated in FIG. 6A, a metal sheet 620 that is formed to the planar shape illustrated in FIG. 1 is prepared. Then, a resist layer 310 is formed on an upper surface of the metal sheet 620, and a resist layer 320 is formed on a lower surface of the metal sheet 620. The metal sheet 620 is a member that finally becomes the second metal layer 62. The metal sheet 620 may be made of copper, stainless steel, aluminum, magnesium alloy, or the like, for example. The thickness of the metal sheet 620 may be approximately 50 μm to approximately 200 μm, for example. For example, a photosensitive dry film resist or the like may be used for the resist layers 310 and 320.

Next, in the manufacturing stage illustrated in FIG. 6B, the resist layer 310 is exposed and developed in a region (a region that becomes the evaporator 10) on the metal sheet 620 where the porous body 60 is to be formed, to form openings 310x that selectively expose the upper surface of the metal sheet 620. In addition, the resist layer 320 is exposed and developed in a region on the metal sheet 620, to form openings 320x that selectively expose the lower surface of the metal sheet 620. The openings 310x and 320x are formed so that the shape and arrangement thereof correspond to the shape and arrangement of the bottomed holes 62x and 62y illustrated in FIG. 5A.

Next, in the manufacturing stage illustrated in FIG. 6C, the metal sheet 620 exposed within the openings 310x is half-etched from the upper surface side of the metal sheet 620, and the metal sheet 620 exposed within the openings 320x is half-etched from the lower surface side of the metal sheet 620. As a result, the bottomed holes 62x are formed in the upper surface side of the metal sheet 620, and the bottomed holes 62y are formed in the lower surface side of the metal sheet 620. In addition, because the openings 310x and the openings 320x, that are alternately arranged along the X-direction on the respective surface sides of the metal sheet 620, partially overlap in the plan view, the partially overlapping parts communicate with each other to form the pores 62z. The half-etching of the metal sheet 620 may use a ferric chloride solution, for example.

Next, in the manufacturing stage illustrated in FIG. 6D, the resist layers 310 and 320 are stripped using a stripping agent. Hence, the second metal layer 62 is completed.

Next, in the manufacturing stage illustrated in FIG. 7A, the first and sixth (or outermost) metal layers 61 and 66, that are continuous layers having no holes or grooves, are prepared. In addition, the third, fourth, and fifth metal layers 63, 64, and 65 are famed by a method similar to the above described method of forming the second metal layer 62. The bottomed holes and the pores in the third, fourth, and fifth metal layers 63, 64, and 65 may be similar to the bottomed holes 62x and 62y and the pores 62z in the second metal layer 62 illustrated in FIG. 5.

Next, in the manufacturing stage illustrated in FIG. 7B, the first through sixth metal layers 61 through 66 are stacked in the order illustrated in FIG. 7A, and are bonded by solid-phase bonding, such as solid-phase welding or the like, for example. The solid-phase bonding may include pressing and heating. As a result, the adjacent metal layers are directly bonded to each other, to complete the loop heat pipe 1 having the evaporator 10, the condenser 20, the vapor pipe 30, and the liquid pipe 40, in which the porous body 60 is formed inside the evaporator 10. Then, after a vacuum pump (not illustrated) or the like is used to exhaust or purge the inside of the liquid pipe 40, the working fluid C is filled into the liquid pipe 40 from the inlet (not illustrated), and the inlet is thereafter sealed.

The solid-phase bonding refers to a method of bonding two welding targets together in the solid-phase (or solid-state) without melting the two welding targets, by heating, softening, and pressing the welding targets to cause plastic deformation. Preferably, the first through fifth metal layers 61 through 66 are all made of the same material, so that the mutually adjacent metal layers can be satisfactorily bonded by the solid-phase bonding.

Accordingly, by employing the structure in which the pores are formed in each metal layer by partially communicating the bottomed holes formed from both the upper and lower surfaces of each metal layer, this embodiment can eliminate the problems encountered by the conventional method of forming the pores, that stacks a plurality of metal layers formed with through-holes so that the through-holes of the plurality of metal layers partially overlap each other. In other words, according to this embodiment, a positional error is not generated when the plurality of metal layers are stacked, and a positional error is not generated due to expansion and contraction of the plurality of metal layers caused by a heat treatment when the plurality of metal layers are stacked. Thus, according to this embodiment, it is possible to form, in the plurality of metal layers, pores having a constant size.

Consequently, it is possible in this embodiment to prevent the capillary force generated by the pores from deteriorating, that is, decreasing, which would otherwise occur if the size of the pores were inconsistent. For this reason, this embodiment can stably obtain the effect of reducing the back-streaming of the vapor Cv from the evaporator 10 to the liquid pipe 40 by the capillary force generated by the pores.

In addition, at the part where the metal layers are stacked, this embodiment employs a structure in which the adjacent bottomed holes overlap in their entirety. For this reason, a bonding area of the stacked metal layers can be made large, to achieve a strong bonding of the stacked metal layers.

First Modification of First Embodiment

In an example of a first modification of the first embodiment, the bottomed holes are also formed in the outermost metal layers. Constituent elements of the loop heat pipe in the first modification of the first embodiment, that are the same as those corresponding constituent elements of the first embodiment described above, are designated by the same reference numerals, and a description thereof may be omitted.

Figure 8:
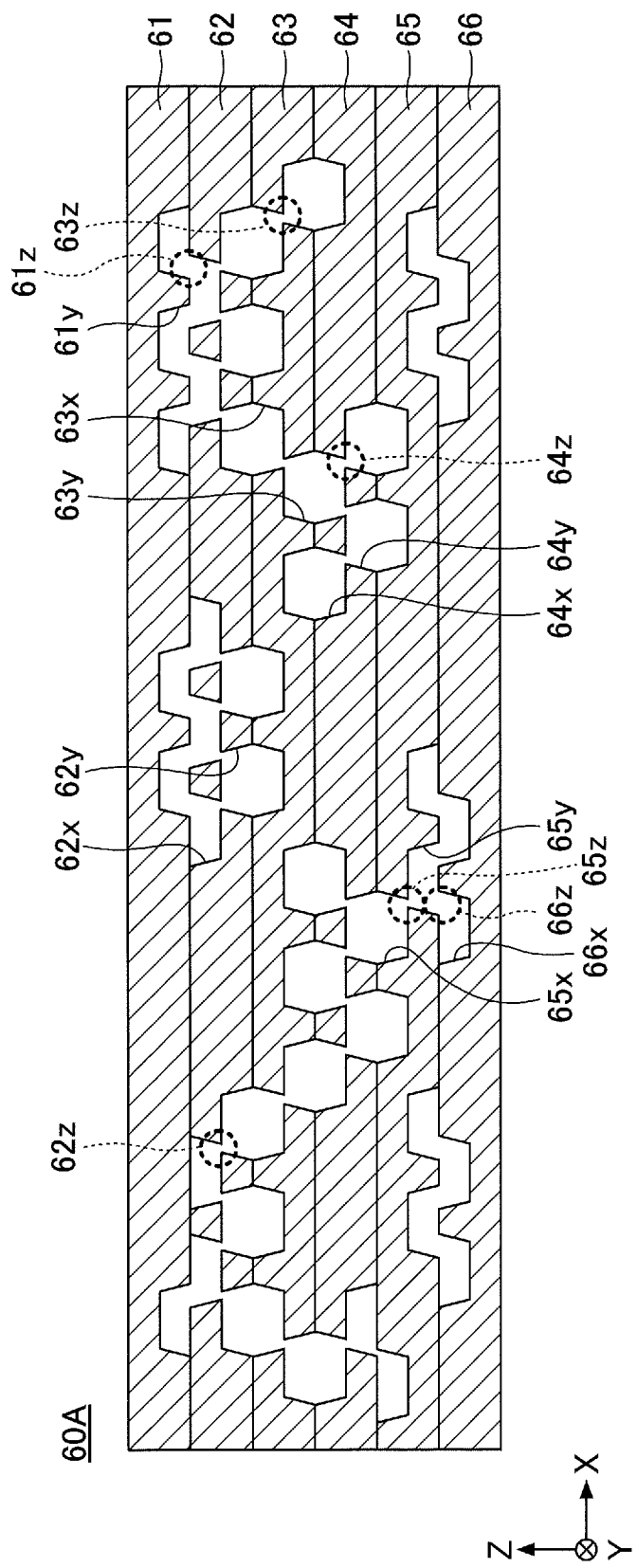
FIG. 8 is a cross sectional view (part 2) illustrating the example of the porous body provided inside the evaporator.
Figure 9A:
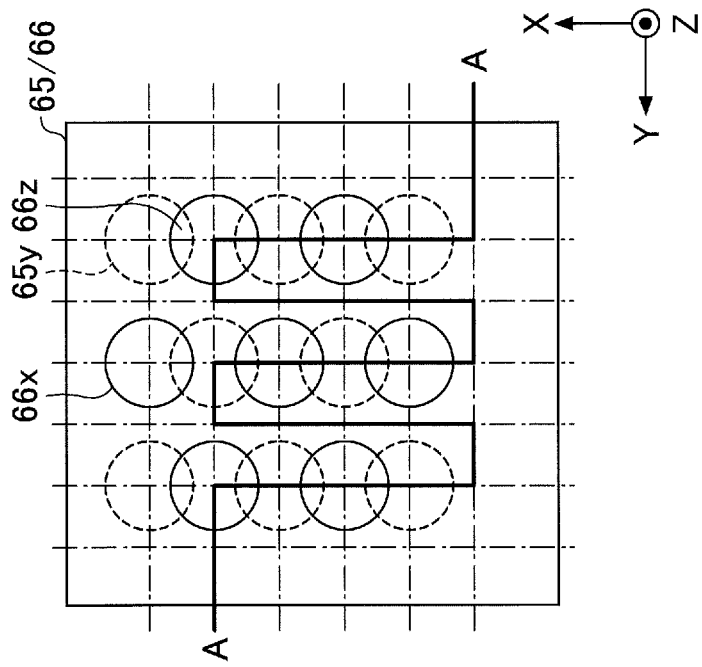
FIG. 9A and FIG. 9B are plan views (part 1) illustrating examples of arrangements of bottomed holes at an interface of adjacent metal layers.
Figure 9B:
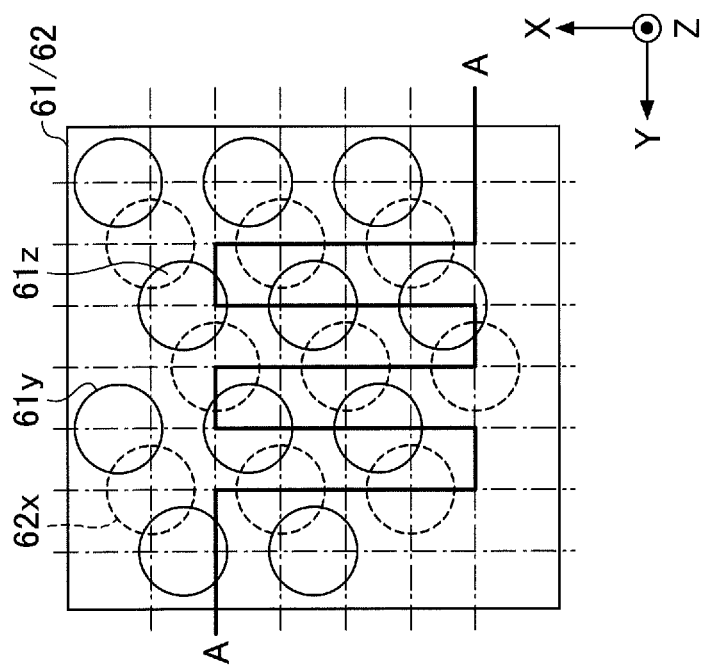

FIG. 8 is a cross sectional view (part 2) illustrating the example of the porous body provided inside the evaporator, and corresponds to the cross section illustrated in FIG. 4. FIG. 9A and FIG. 9B are plan views (part 1) illustrating examples of arrangements of bottomed holes at an interface of adjacent metal layers. FIG. 9A illustrates the arrangement of the bottomed holes at the interface between the first metal layer 61 and the second metal layer 62, and FIG. 9B illustrates the arrangement of the bottomed holes at the interface between the fifth metal layer 65 and the sixth metal layer 66. In FIG. 9A and FIG. 9B, a part along a line A-A corresponds to the cross section illustrated in FIG. 8.

A porous body 60A illustrated in FIG. 8, FIG. 9A, and FIG. 9B has a structure similar to the porous body 60, and includes 6 metal layers 61 through 66. The structure of the second through fifth metal layers 62 through 65 is similar to that of the porous body 60. The porous body 60A differs from the porous body 60, in that the bottomed holes are also formed in the first metal layer (one outermost layer) 61 and the sixth metal layer (the other outermost layer) 66.

As illustrated in FIG. 9A, the first metal layer 61 includes a plurality of bottomed holes 61y. The bottomed holes 61x cave in from a lower surface of the first metal layer 61 to an approximate center part along a thickness direction thereof.

In the plan view of the first and second metal layers 61 and 62, the row in which the bottomed holes 61y are arranged along the X-direction, and the row in which the bottomed holes 62x are arranged along the X-direction, are alternately arranged along the Y-direction. In these rows that are alternately arranged along the Y-direction, the bottomed holes 61y and the bottomed holes 62x of the adjacent rows partially overlap in the plan view, and the partially overlapping parts of the bottomed holes 61y and the bottomed holes 62x communicate with each other to form pores 61z.

However, center positions of the adjacent bottomed holes 61y and 62x that form the pore 61z are offset along the X-direction. In other words, the adjacent bottomed holes 61y and 62x that form the pores 61z are alternately arranged along a direction that is oblique with respect to both the X-direction and the Y-direction. The size, shape, or the like of the bottomed holes 61y and the pores 61z may be similar to the size, shape, or the like of the bottomed holes 62x and the pores 62z.

As illustrated in FIG. 8 an FIG. 9B, the sixth metal layer 66 includes a plurality of bottomed holes 66x. The bottomed holes 66x cave in from an upper surface of the sixth metal layer 66 to an approximate center along a thickness direction thereof.

In the plan view of the fifth metal layer 65 and the sixth metal layer 66, bottomed holes 66x and the bottomed holes 65y are alternately arranged along the X-direction. In addition, in the plan view of the fifth metal layer 65 and the sixth metal layer 66, bottomed holes 66x and the bottomed holes 65y are alternately arranged along the Y-direction. The bottomed holes 66x and the bottomed holes 65y, that are alternately arranged along the X-direction, partially overlap in the plan view, and the partially overlapping parts of the bottomed holes 66x and the bottomed holes 65y communicate with each other to form pores 66z. The bottomed holes 66x and the bottomed holes 65y, that are alternately arranged along the Y-direction, are arranged at predetermined intervals and do not overlap in the plan view. For this reason, the bottomed holes 66x and the bottomed holes 65y, that are alternately arranged along the Y-direction, do not form pores. The size, shape, or the like of the bottomed holes 66x and the pores 66z may be similar to the size, shape, or the like of the bottomed holes 62x and the pores 62z.

In the porous body 60A in this first modification, the bottomed holes 61y are formed only in the lower surface of the first metal layer (one outermost layer) 61 in contact with the second metal layer 62, and the bottomed holes 61y partially communicate with the bottomed holes 62x formed in the second metal layer 62, to form the pores 61z. In addition, the bottomed holes 66x are formed only in the upper surface of the sixth metal layer (the other outermost layer) 66 in contact with the fifth metal layer 65, and the bottomed holes 66x partially communicate with the bottomed holes 65y formed in the fifth metal layer 65, to form the pores 66z.

Accordingly, the number of pores in the porous body 60A can be increased compared to the number of pores in the porous body 60, to further improve the capillary force generated by the pores. As a result, this first modification can further improve the effect of reducing the back-streaming of the vapor Cv from the evaporator 10 to the liquid pipe 40 by the capillary force generated by the pores.

The pores 61z and 66z are formed between the adjacent metal layers, similarly as in the case of the conventional porous body. Consequently, the size of the pores 61z and 66z may become inconsistent, similarly as in the case of the conventional porous body. However, in this first modification, a basic capillary force is already stably secured by each of the pores formed in each of the second through fifth metal layers 62 through 65, and the pores 61z and 66z function to exhibit the capillary force in addition to the basic capillary force. For this reason, the conventional problem of not being able to obtain the capillary force to a sufficient extent will not occur according to this first modification.

Second Modification of First Embodiment

In an example of a second modification of the first embodiment, the pores are also formed at the interface between 2 adjacent metal layers of the porous body. Constituent elements of the loop heat pipe in the second modification of the first embodiment, that are the same as those corresponding constituent elements of the first embodiment described above, are designated by the same reference numerals, and a description thereof may be omitted.

Figure 10:
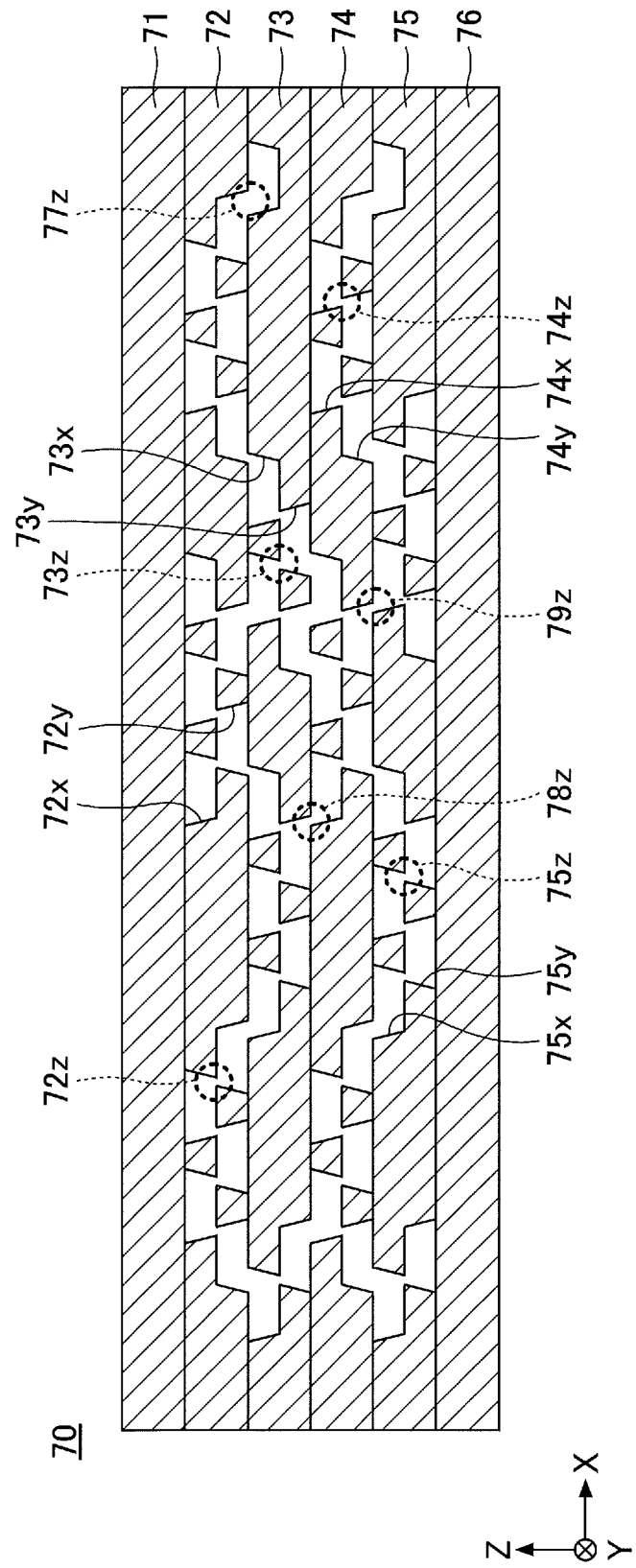
FIG. 10 is a cross sectional view (part 3) illustrating the example of the porous body provided inside the evaporator.
Figure 11A:
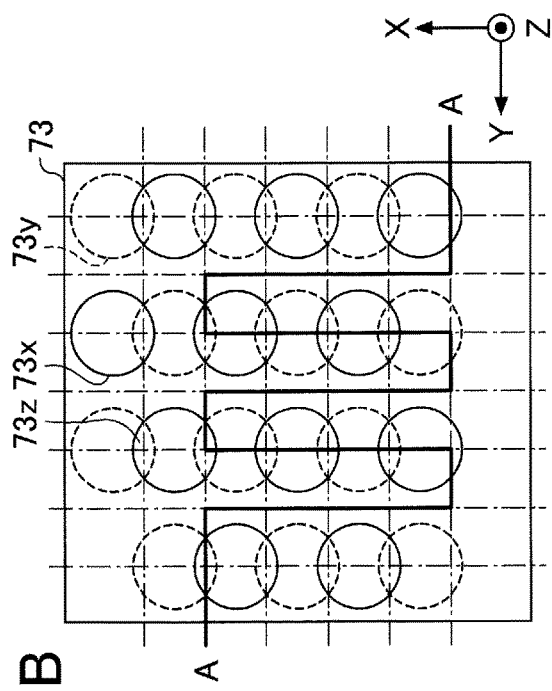
FIG. 11A, FIG. 11B, FIG. 11C, and FIG. 11D are plan views (part 2) illustrating the examples of the arrangements of the bottomed holes in each of the second through fifth metal layers.
Figure 11B:
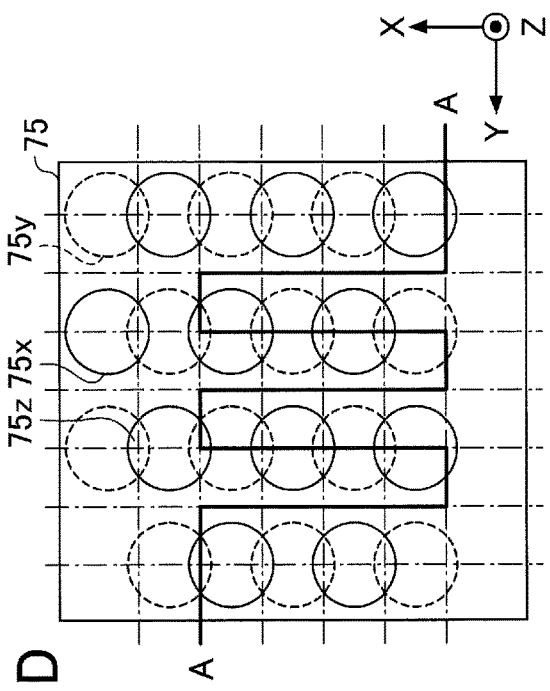
Figure 11C:
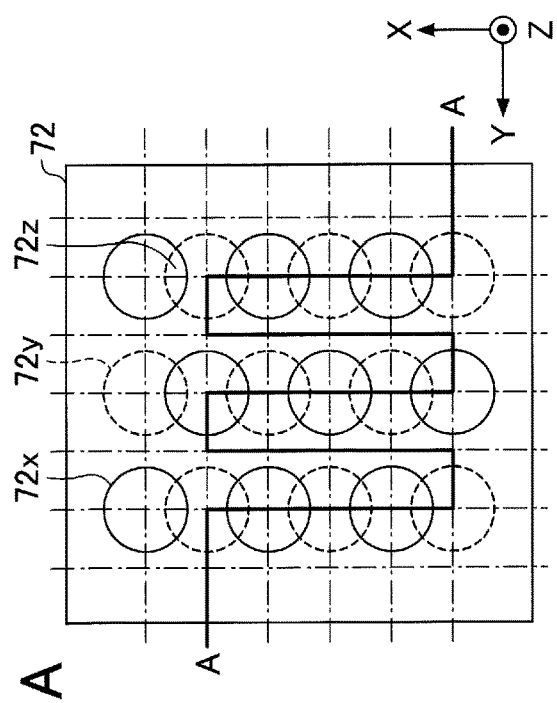
Figure 11D:
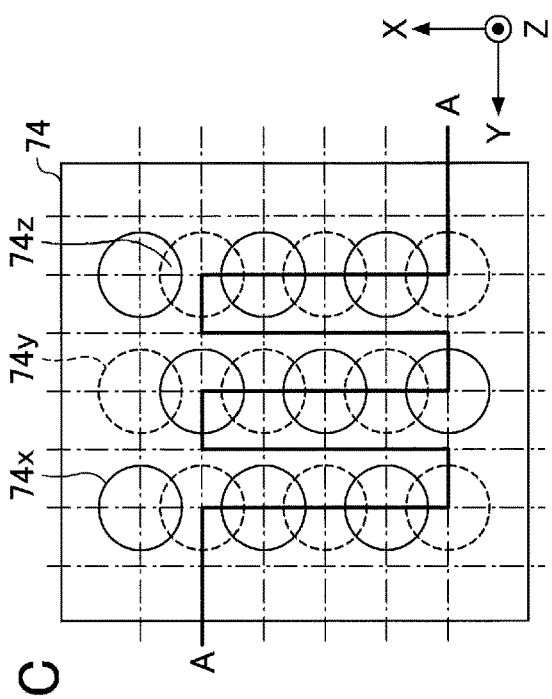
Figure 12A:
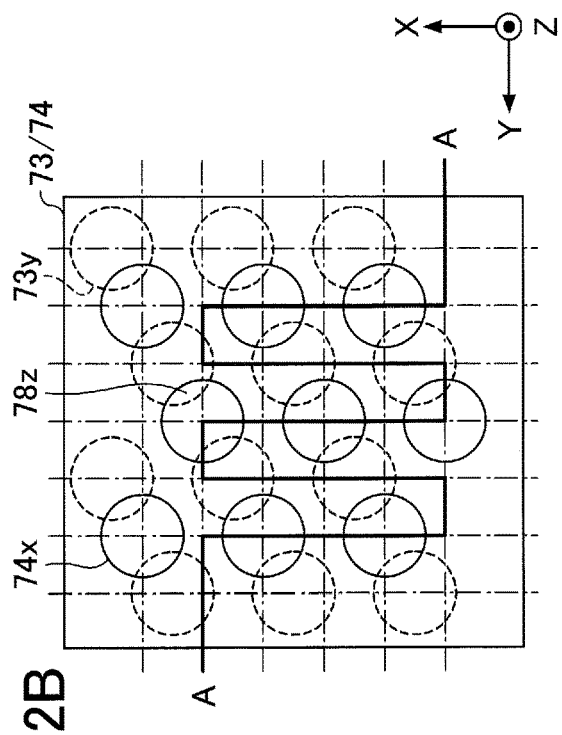
FIG. 12A, FIG. 12B, and FIG. 12C are plan views (part 2) illustrating the examples of the arrangements of the bottomed holes at the interface of the adjacent metal layers.
Figure 12B:
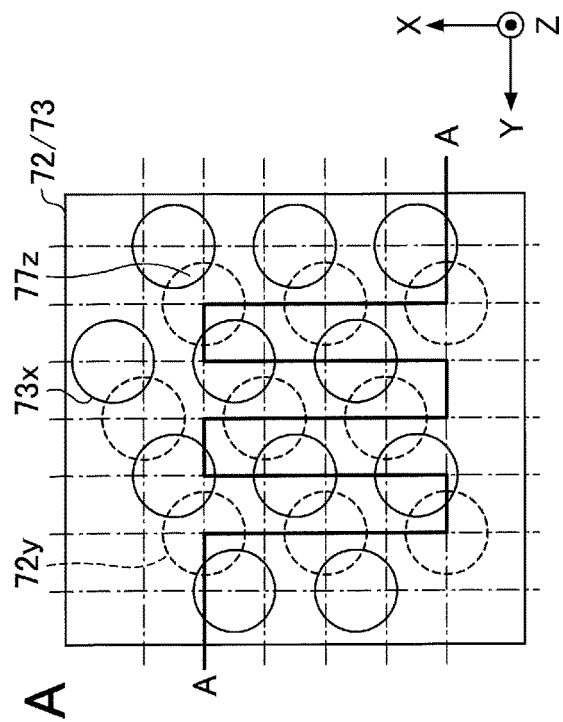
Figure 12C:
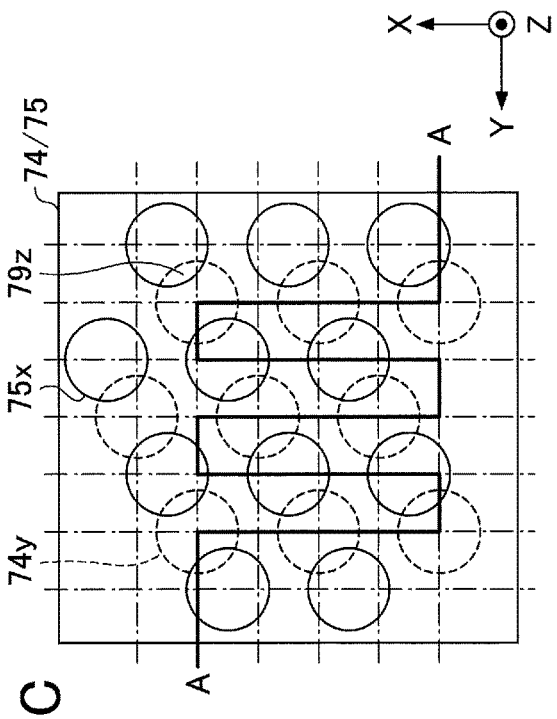

FIG. 10 is a cross sectional view (part 3) illustrating the example of the porous body provided inside the evaporator, and corresponds to the cross section illustrated in FIG. 4. FIG. 11A, FIG. 11B, FIG. 11C, and FIG. 11D are plan views (part 2) illustrating the examples of the arrangements of the bottomed holes in each of the second through fifth metal layers. FIG. 11A illustrates the arrangement of the bottomed holes in a second metal layer 72, FIG. 11B illustrates the arrangement of the bottomed holes in a third metal layer 73, FIG. 11C illustrates the arrangement of the bottomed holes in a fourth metal layer 74, and FIG. 11D illustrates the arrangement of the bottomed holes in a fifth metal layer 75. FIG. 12A, FIG. 12B, and FIG. 12C are plan views (part 2) illustrating the examples of the arrangements of the bottomed holes at the interface of the adjacent metal layers. FIG. 12A illustrates the arrangement of the bottomed holes at an interface between the second metal layer 72 and the third metal layer 73, FIG. 12B illustrates the arrangement of the bottomed holes at an interface between the third metal layer 73 and the fourth metal layer 74, and FIG. 12C illustrates the arrangement of the bottomed holes at an interface between the fourth metal layer 74 and the fifth metal layer 75. In FIG. 11A through FIG. 11D and FIG. 12A through FIG. 12C, a part along a line A-A corresponds to the cross section illustrated in FIG. 10.

As illustrated in FIG. 10, a porous body 70 in this second modification may have a structure that is formed by successively stacking 6 metal layers 71 through 76, for example. The material, the thickness, the bonding method, or the like of the first through sixth metal layers 71 through 76 may be similar to those of the first through sixth metal layers 61 through 66 described above. In addition, sizes of bottomed holes and pores formed in the second through fifth metal layers 72 through 75 may be similar to those of the bottomed holes and the pores formed in the second through fifth metal layers 62 through 65 described above.

In the porous body 70, the first metal layer (one outermost layer) 71 and the sixth metal layer (the other outermost layer) 76 include no holes or grooves. On the other hand, as illustrated in FIG. 10 and FIG. 11A, the second metal layer 72 includes a plurality of bottomed holes 72x and a plurality of bottomed holes 72y. The bottomed holes 72x cave in from an upper surface of the second metal layer 72 to an approximate center part along a thickness direction thereof. The bottomed holes 72y cave in from a lower surface of the second metal layer 72 to the approximate center part along the thickness direction thereof.

Positional relationships of the bottomed holes 72x and the bottomed holes 72y are similar to the positional relationships of the bottomed holes 62x and the bottomed holes 62y illustrated in FIG. 5A. In other words, the bottomed holes 72x and the bottomed holes 72y that are alternately arranged along the X-direction partially overlap in the plan view, and the partially overlapping parts of the bottomed holes 72x and the bottomed holes 72y communicate with each other to form pores 72z. The bottomed holes 72x and the bottomed holes 72y that are alternately arranged along the Y-direction are arranged at predetermined intervals, and do not overlap in the plan view. For this reason, the bottomed holes 72x and the bottomed holes 72y that are alternately arranged along the Y-direction do not form pores.

As illustrated in FIG. 11B, the third metal layer 73 includes a plurality of bottomed holes 73x and a plurality of bottomed holes 73y. The bottomed holes 73x cave in from an upper surface of the third metal layer 73 to an approximate center part along a thickness direction thereof. The bottomed holes 73y cave in from a lower surface of the third metal layer 73 to the approximate center part along the thickness direction thereof.

In the plan view, the bottomed holes 73x and the bottomed holes 73y are alternately arranged along the X-direction. In addition, in the plan view, the bottomed holes 73x and the bottomed holes 73y are alternately arranged along the Y-direction. The bottomed holes 73x and the bottomed holes 73y that are alternately arranged along the X-direction partially overlap in the plan view, and the partially overlapping parts of the bottomed holes 73x and the bottomed holes 73y communicate with each other to form pores 73z. The bottomed holes 73x and the bottomed holes 73y that are alternately arranged along the Y-direction are arranged at predetermined intervals, and do not overlap in the plan view. For this reason, the bottomed holes 73x and the bottomed holes 73y that are alternately arranged along the Y-direction do not form pores.

An imaginary line connecting centers of each of the bottomed holes 72x and the bottomed holes 72y that are alternately arranged along the X-direction in the second metal layer 72, and an imaginary line connecting centers of each of the bottomed holes 73x and 73y that are alternately arranged along the X-direction in the third metal layer 73, are arranged with an offset, along the Y-direction, amounting to approximately the radius of each of the bottomed holes in the plan view. In addition, an imaginary line connecting centers of each of the bottomed holes 72x and the bottomed holes 72y that are alternately arranged along the Y-direction in the second metal layer 72, and an imaginary line connecting centers of each of the bottomed holes 73x and 73y that are alternately arranged along the Y-direction in the third metal layer 73, are arranged with an offset, along the X-direction, amounting to approximately the radius of each of the bottomed holes in the plan view.

For this reason, as illustrated in FIG. 12A, the bottomed holes 72y and the bottomed holes 73x partially overlap in the plan view, at the interface between the second metal layer 72 and the third metal layer 73, and the partially overlapping parts of the bottomed holes 72y and the bottomed holes 73x communicate with each other to form pores 77z. The bottomed holes 72y and the bottomed holes 73x that form the pores 77z are alternately arranged along a direction that is oblique with respect to both the X-direction and the Y-direction.

As illustrated in FIG. 10 and FIG. 11C, the fourth metal layer 74 includes a plurality of bottomed holes 74x and a plurality of bottomed holes 74y. The bottomed holes 74x cave in from an upper surface of the fourth metal layer 74 to an approximate center part along a thickness direction thereof. The bottomed holes 74y cave in from a lower surface of the fourth metal layer 74 to the approximate center part along the thickness direction thereof.

Positional relationships of the bottomed holes 74x and the bottomed holes 74y are similar to the positional relationships of the bottomed holes 72x and the bottomed holes 72y illustrated in FIG. 11A. In other words, the bottomed holes 74x and the bottomed holes 74y that are alternately arranged along the X-direction partially overlap in the plan view, and the partially overlapping parts of the bottomed holes 74x and the bottomed holes 74y communicate with each other to form pores 74z. The bottomed holes 74x and the bottomed holes 74y that are alternately arranged along the Y-direction are arranged at predetermined intervals, and do not overlap in the plan view. For this reason, the bottomed holes 74x and the bottomed holes 74y that are alternately arranged along the Y-direction do not form pores.

As illustrated in FIG. 12B, the bottomed holes 73y and the bottomed holes 74x partially overlap in the plan view, at the interface between the third metal layer 73 and the fourth metal layer 74, and the partially overlapping parts of the bottomed holes 73y and the bottomed holes 74x communicate with each other to form pores 78z. The bottomed holes 73y and the bottomed holes 74x that form the pores 78z are alternately arranged along the direction that is oblique with respect to both the X-direction and the Y-direction.

As illustrated in FIG. 11D, the fifth metal layer 75 includes a plurality of bottomed holes 75x and a plurality of bottomed holes 75y. The bottomed holes 75x cave in from an upper surface of the fifth metal layer 75 to an approximate center part along a thickness direction thereof. The bottomed holes 75y cave in from a lower surface of the fifth metal layer 75 to the approximate center part along the thickness direction thereof.

Positional relationships of the bottomed holes 75x and the bottomed holes 75y are similar to the positional relationships of the bottomed holes 73x and the bottomed holes 73y illustrated in FIG. 11B. In other words, the bottomed holes 75x and the bottomed holes 75y that are alternately arranged along the X-direction partially overlap in the plan view, and the partially overlapping parts of the bottomed holes 75x and the bottomed holes 75y communicate with each other to form pores 75z. The bottomed holes 75x and the bottomed holes 75y that are alternately arranged along the Y-direction are arranged at predetermined intervals, and do not overlap in the plan view. For this reason, the bottomed holes 75x and the bottomed holes 75y that are alternately arranged along the Y-direction do not form pores.

As illustrated in FIG. 12C, the bottomed holes 74y and the bottomed holes 75x partially overlap in the plan view, at the interface between the fourth metal layer 74 and the fifth metal layer 75, and the partially overlapping parts of the bottomed holes 74y and the bottomed holes 75x communicate with each other to form pores 79z. The bottomed holes 74y and the bottomed holes 75x that form the pores 79z are alternately arranged along the direction that is oblique with respect to both the X-direction and the Y-direction.

According to the porous body 70 in the second modification, the pores are provided at the interface between the adjacent metal layers among the second through fifth metal layers 72 through 75.

Hence, the number of pores in the porous body 70 can be increased compared to the number of pores in the porous body 60, to further improve the capillary forge generated by the pores. As a result, this second modification can further improve the effect of reducing the back-streaming of the vapor Cv from the evaporator 10 to the liquid pipe 40 by the capillary force generated by the pores.

The size of pores provided at the interface between the adjacent metal layers may become inconsistent, similarly as in the case of the conventional porous body. However, in this second modification, the basic capillary force is already stably secured by each of the pores formed in each of the second through fifth metal layers 72 through 75, and the pores provided at the interface between the adjacent metal layers function to exhibit the capillary force in addition to the basic capillary force. For this reason, the conventional problem of not being able to obtain the capillary force to a sufficient extent will not occur according to this second modification.

Third Modification of First Embodiment

In an example of a third modification of the first embodiment, the bottomed holes are also formed in the outermost metal layers in the second modification. Constituent elements of the loop heat pipe in the third modification of the first embodiment, that are the same as those corresponding constituent elements of the first embodiment and the first and second modifications described above, are designated by the same reference numerals, and a description thereof may be omitted.

Figure 13:
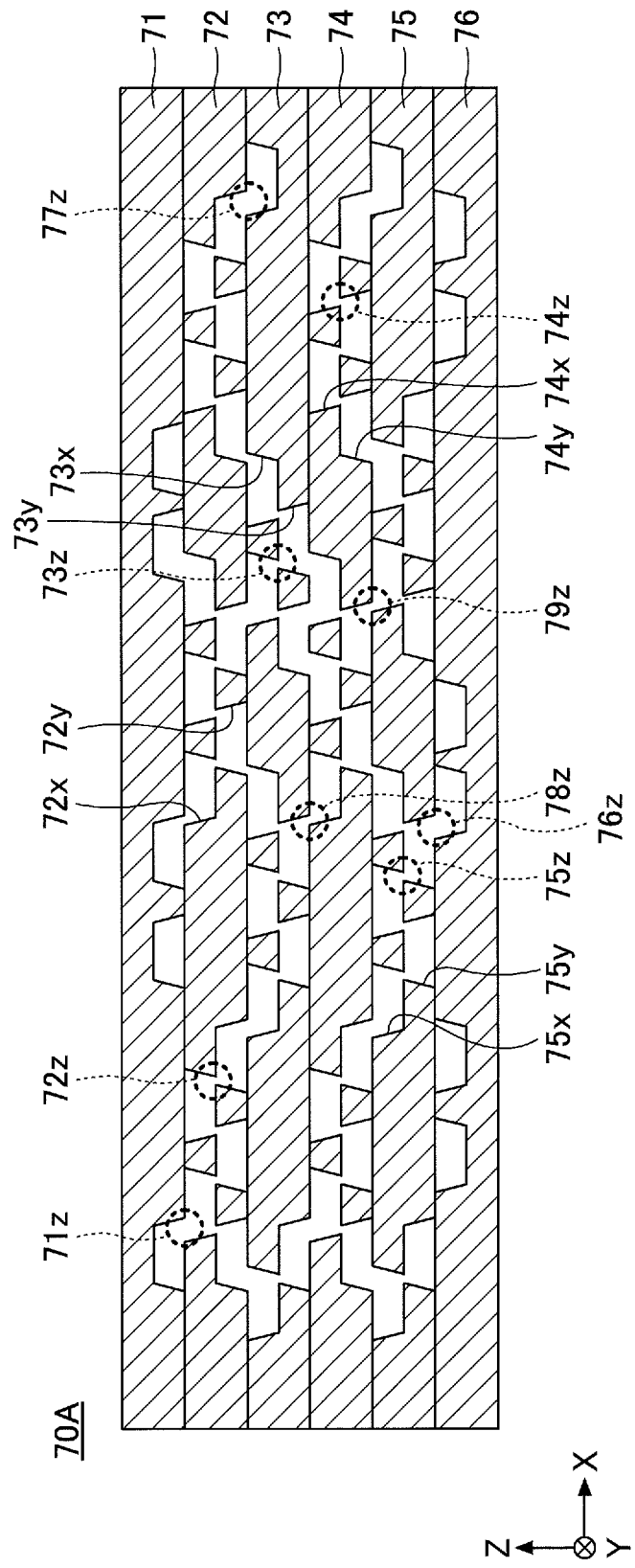
FIG. 13 is a cross sectional view (part 4) illustrating the example of the porous body provided inside the evaporator.
Figure 14:
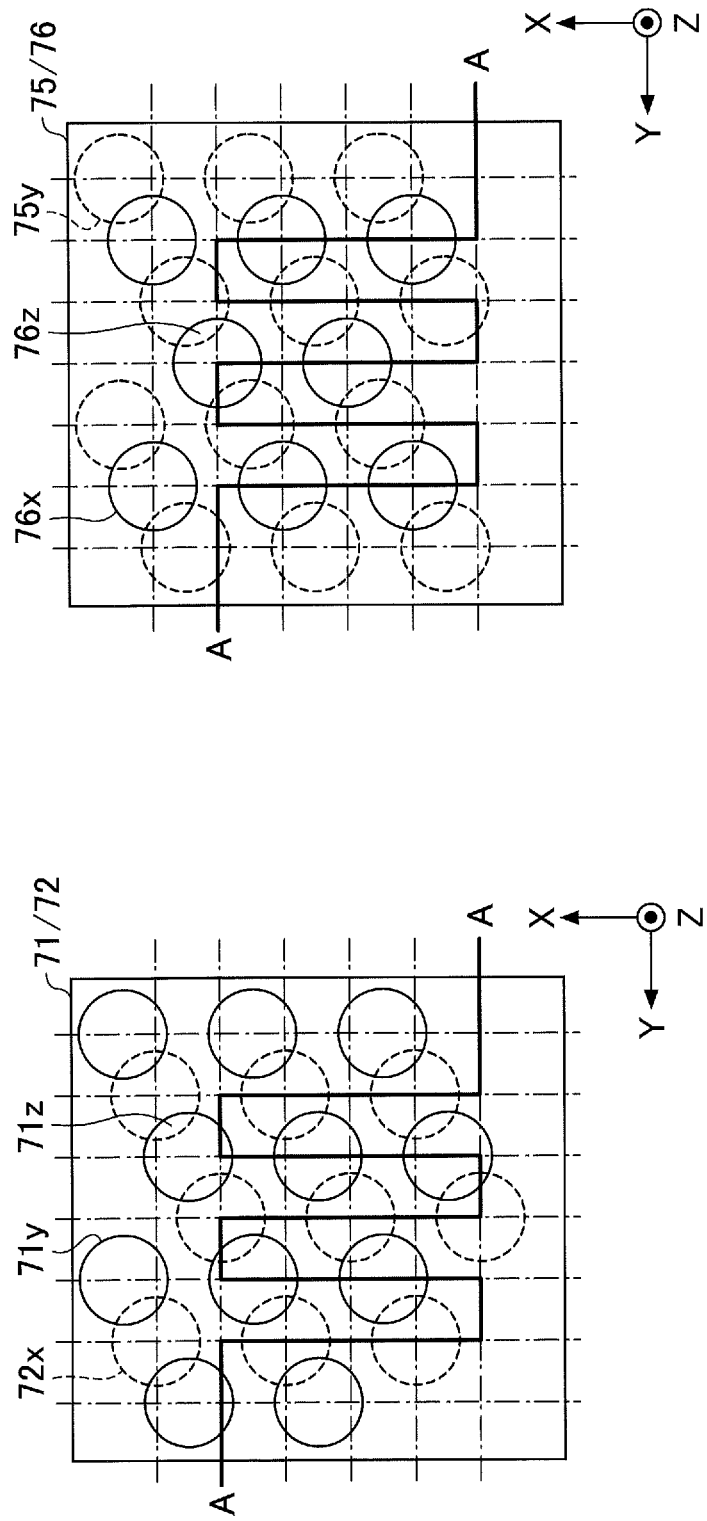
FIG. 14A and FIG. 14B are plan views (part 3) illustrating the examples of the arrangements of the bottomed holes at the interface of the adjacent metal layers.

FIG. 13 is a cross sectional view (part 4) illustrating the example of the porous body provided inside the evaporator, and corresponds to the cross section illustrated in FIG. 4. FIG. 14A and FIG. 14B are plan views (part 3) illustrating the examples of the arrangements of the bottomed holes at the interface of the adjacent metal layers. FIG. 14A illustrates the arrangement of the bottomed holes at an interface between the first metal layer 71 and the second metal layer 72, and FIG. 14B illustrates the arrangement of the bottomed holes at an interface between the fifth metal layer 75 and the sixth metal layer 76. In FIG. 14A and FIG. 14B, a part along a line A-A corresponds to the cross section illustrated in FIG. 13.

As illustrated in FIG. 13, FIG. 14A, and FIG. 14B, a porous body 70A in this third modification may have a structure that is formed by successively stacking 6 metal layers 71 through 76, for example, similarly to the porous body 70. However, the porous body 70A differs from the porous body 70 in that the bottomed holes are also formed in the first metal layer (one outermost layer) 71 and the sixth metal layer (the other outermost layer) 76.

As illustrated in FIG. 14A, the first metal layer 71 includes a plurality of bottomed holes 71y that cave in from the lower surface of the first metal layer 71 to the approximate center part along the thickness direction thereof. Positional relationships of the bottomed holes 71y and the bottomed holes 72x are similar to the positional relationships of the bottomed holes 61y and the bottomed holes 62x illustrated in FIG. 9A. In other words, the bottomed holes 71y and the bottomed holes 72x partially overlap in the plan view, and the partially overlapping parts of the bottomed holes 71y and the bottomed holes 72x communicate with each other to form pores 71z.

As illustrated in FIG. 13 and FIG. 14B, the sixth metal layer 76 includes a plurality of bottomed holes 76x that cave in from the upper surface of the sixth metal layer 76 to the approximate center part along the thickness direction thereof.

In the plan view of the fifth and sixth metal layers 75 and 76, rows in which the bottomed holes 75y are arranged along the X-direction, and rows in which the bottomed holes 76x are arranged along the X-direction, are alternately arranged along the Y-direction. In the rows alternately arranged along the Y-direction, the bottomed holes 75y and the bottomed holes 76x in the adjacent rows partially overlap in the plan view, and the overlapping parts of the bottomed holes 75y and the bottomed holes 76x communicate with each other to form pores 76z.

However, center positions of the adjacent bottomed holes 75y and 76x that form the pore 76z are offset along the X-direction. In other words, the adjacent bottomed holes 75y and 76x that form the pores 76z are alternately arranged along a direction that is oblique with respect to both the X-direction and the Y-direction.

According to the porous body 70A in the third modification, the bottomed holes 71y are formed only in one surface (that is, the lower surface) of the first metal layer (one outermost layer) 71 in contact with the second metal layer 72. In addition, the bottomed holes 71y partially communicate with the bottomed holes 72x formed in the second metal layer 72, to form the pores 71z. On the other hand, the bottomed holes 76x are formed only in one surface (that is, the upper surface) of the sixth metal layer (the other outermost layer) 76 in contact with the fifth metal layer 76. Further, the bottomed holes 76x partially communicate with the bottomed holes 75y formed in the fifth metal layer 75, to form the pores 76z.

Hence, the number of pores in the porous body 70A can be increased compared to the number of pores in the porous body 70, to further improve the capillary force generated by the pores. As a result, this third modification can further improve the effect of reducing the back-streaming of the vapor Cv from the evaporator 10 to the liquid pipe 40 by the capillary force generated by the pores.

The pores 71z and 76z are formed between the adjacent metal layers, similarly as in the case of the conventional porous body. Consequently, the size of the pores 71z and 76z may become inconsistent, similarly as in the case of the conventional porous body. However, in this third modification, the basic capillary force is already stably secured by each of the pores formed in each of the second through fifth metal layers 72 through 75, and the pores 71z and 76z function to exhibit the capillary force in addition to the basic capillary force. For this reason, the conventional problem of not being able to obtain the capillary force to a sufficient extent will not occur according to this third modification.

Fourth Modification of First Embodiment

Figure 15:
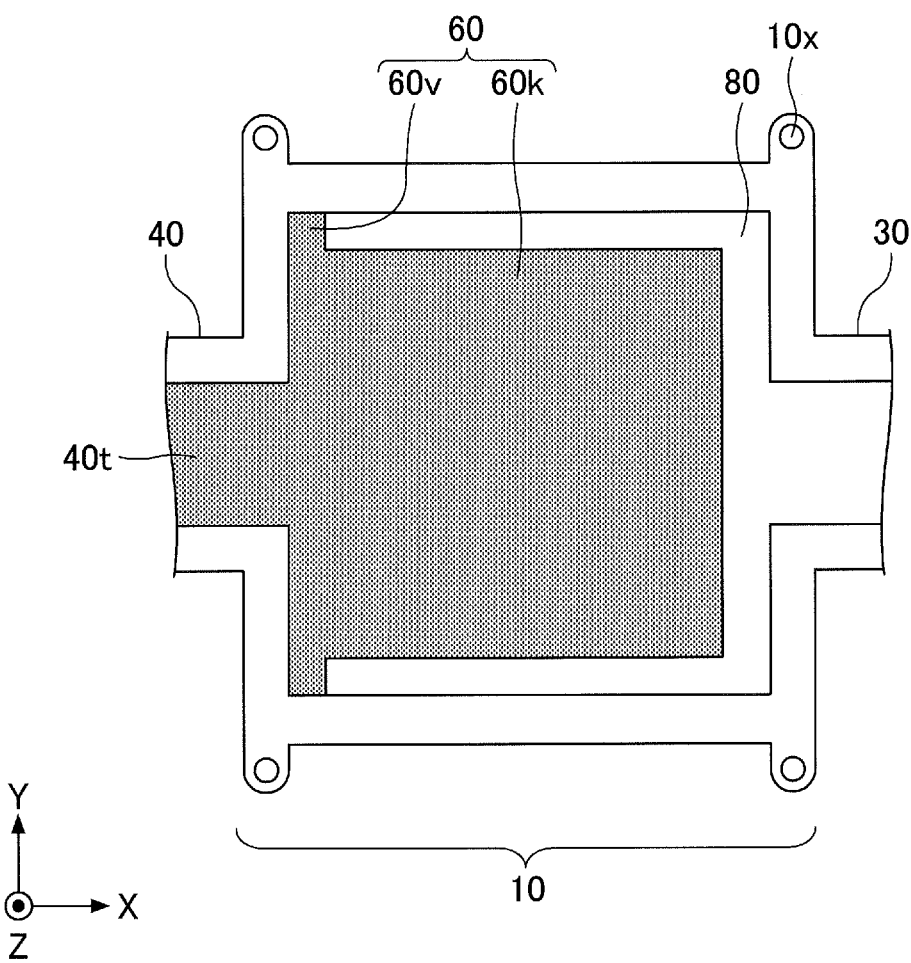
FIG. 15 is a plan view illustrating the evaporator and the periphery thereof of the loop heat pipe in a fourth modification of the first embodiment.

FIG. 15 is a plan view illustrating the evaporator and the periphery thereof of the loop heat pipe in a fourth modification of the first embodiment. FIG. 15 illustrates a planar shape of the porous body 60 inside the evaporator 10, and thus, the illustration of the metal layer (the first metal layer 61 illustrated in FIG. 4) at one outermost layer of the porous body 60 will be omitted.

The porous body 60 inside the evaporator 10, illustrated in FIG. 15, includes a connecting part 60v and a protruding part 60k.

In the plan view, the connecting part 60v is provided on the side closest to the liquid pipe 40 along the X-direction (the side where the liquid pipe 40 connects to the evaporator 10), and extends in the Y-direction. A part of a surface of the connecting part 60v, on the side of the liquid pipe 40, makes contact with the pipe wall of the evaporator 10. A remaining part of the surface of the connecting part 60v, on the side of the liquid pipe 40, connects to the porous body 40t provided inside the flow passage of the liquid pipe 40. In addition, a part of a surface of the connecting part 60v, on the side of the vapor pipe 30, connects to the protruding part 60k. A remaining part of the surface of the connecting part 60v, on the side of the vapor pipe 30, makes contact with the space 80.

In the plan view, the protruding part 60k protrudes from the connecting part 60v toward the vapor pipe 30. In the example illustrated in FIG. 15, only one protruding part 60k is provided.

An end part of the protruding part 60k on the side of the vapor pipe 30 is separated from the pipe wall of the evaporator 10. On the other hand, an end part of the protruding part 60k on the side of the liquid pipe 40 is connected to the pipe wall of the evaporator 10 via the connecting part 60v. In other words, in the plan view, the porous body 60 inside the evaporator 10 is formed to a shape made up of the connecting part 60v and the single protruding part 60k. The space 80 is formed inside the evaporator 10 in a region where the porous body 60 is not provided. The space 80 communicates to the flow passage of the vapor pipe 30.

Figure 16:
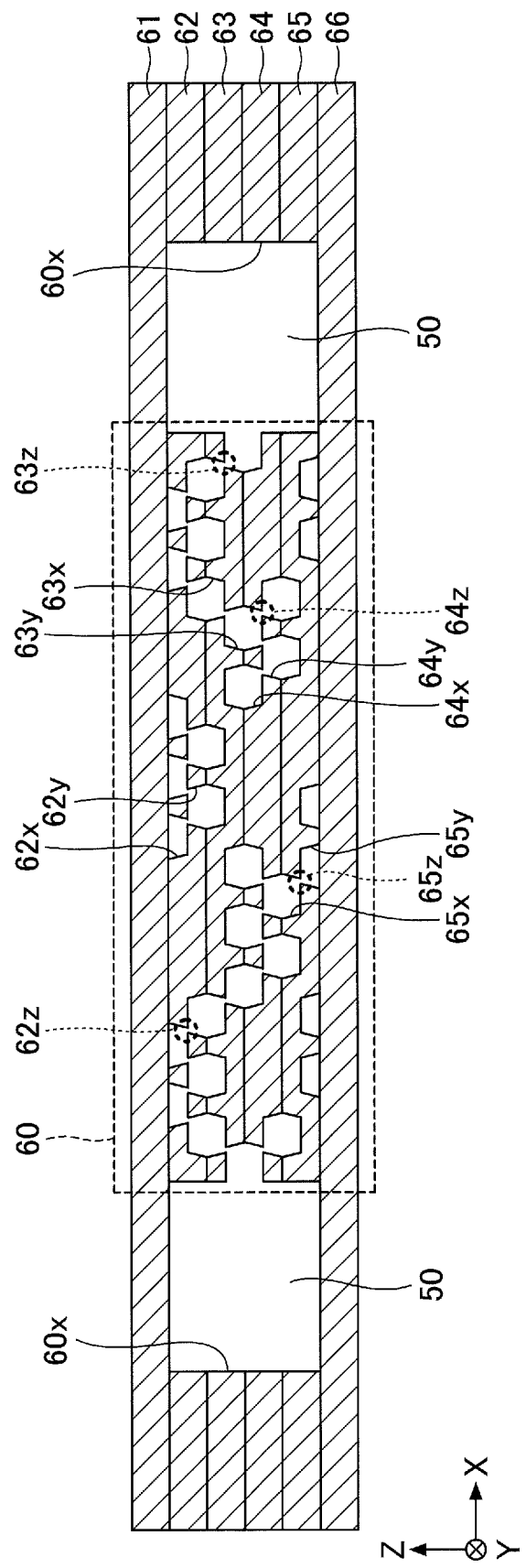
FIG. 16 is a cross sectional view illustrating an example of the porous body provided inside the evaporator.

Accordingly, the planar shape of the porous body 60 inside the evaporator 10 does not necessarily have to be the comb shape, and may have the shape illustrated in FIG. 16 made up of the connecting part 60v and the single protruding part 60k. Alternatively, the porous body 60 inside the evaporator 10 may have a planar shape other than those illustrated in FIG. 3 and FIG. 15. The porous body 60 inside the evaporator 10 may have any planar shape, as long as the working fluid C can permeate into the porous body 60 and the space 80 is provided to flow the vapor Cv of the vaporized working fluid C to vapor pipe 30.

Second Embodiment

A second embodiment will be described, in which the porous body is provided inside the liquid pipe, in addition to being provided inside the evaporator. Constituent elements of the loop heat pipe in the second embodiment, that are the same as those corresponding constituent elements of the first embodiment described above, are designated by the same reference numerals, and a description thereof may be omitted.

FIG. 16 is a cross sectional view illustrating an example of the porous body provided inside the evaporator, and corresponds to the cross section along a line B-B in FIG. 1. As illustrated in FIG. 16, the porous body 60, similar to the porous body 60 provided inside the evaporator 10, is provided inside the liquid pipe 40. A flow passage 50 through which the working fluid C flows, is formed on both sides of the porous body 60. More particularly, one flow passage 50 is formed between one side surface (left side surface) of the porous body 60 in FIG. 16 and one pipe surface (left inner wall surfaces of the second through fifth metal layers 62 through 65) in FIG. 16. Another flow passage 50 is formed between the other side surface (right side surface) of the porous body 60 in FIG. 16 and the other pipe surface (right inner wall surfaces of the second through fifth metal layers 62 through 65) in FIG. 16.

At least a part of the bottomed surfaces of the porous body 60 communicate to the flow passages 50. Hence, the working fluid C can permeate into the porous body 60. In addition, because the porous body 60 is provided at approximately a center part inside the liquid pipe 40, the porous body 60 can also function as a column support. Accordingly, the porous body 60 that functions as the column support can prevent the liquid pipe 40 from collapsing due to the pressing when the solid-phase bonding is performed to bond the first through sixth metal layers 61 through 66.

In principle, the porous body 60 provided inside the liquid pipe 40 is similar to the porous body 60 provided inside the evaporator 10. For example, the positions of the bottomed holes and the pores formed in the second through fifth metal layers 62 through 65 may be similar to those illustrated in FIG. 4 and FIG. 5A through FIG. 5D. Hence, the porous body 60 provided inside the liquid pipe 40 will be described by referring to the drawings used to describe the first embodiment.

The porous body 60 may have a structure that is formed by successively stacking 6 metal layers 61 through 66, for example. The metal layers 61 through 66 are copper layers having a high thermal conductivity, for example, and the metal layers 61 through 66 are directly bonded to each other by solid-phase bonding or the like. Each of the metal layers 61 through 66 has a thickness of approximately 50 μm to approximately 200 μm, for example. Of course, the metal layers 61 through 66 are not limited to the copper layers, and may be stainless steel layers, aluminum layers, magnesium alloy layers, or the like, for example. In addition, the number of metal layers that are stacked is not limited to 6, and the number of metal layers that are stacked may be 5 or less, or 7 or more.

In the porous body 60, the first metal layer (one outermost layer) 61 and the sixth metal layer (the other outermost layer) 66 include no holes or grooves. On the other hand, as illustrated in FIG. 4 and FIG. 5A, the second metal layer 62 includes a plurality of bottomed holes 62x and a plurality of bottomed holes 62y. The bottomed holes 62x cave in from the upper surface of the second metal layer 62 to an approximate center part along the thickness direction thereof. The bottomed holes 62y cave in from the lower surface of the second metal layer 62 to the approximate center part along the thickness direction.

In the plan view, the bottomed holes 62x and the bottomed holes 62y are alternately arranged along the X-direction. In addition, in the plan view, the bottomed holes 62x and the bottomed holes 62y are alternately arranged along the Y-direction. The bottomed holes 62x and the bottomed holes 62y that are alternately arranged along the X-direction partially overlap in the plan view, and the partially overlapping parts of the bottomed holes 62x and the bottomed holes 62y communicate with each other to form pores 62z. The bottomed holes 62x and the bottomed holes 62y that are alternately arranged along the Y-direction are arranged at predetermined intervals, and do not overlap in the plan view. For this reason, the bottomed holes 62x and the bottomed holes 62y that are alternately arranged along the Y-direction do not form pores.

The bottomed holes 62x and 62y may have a circular shape having a diameter of approximately 100 μm to approximately 300 μm, for example. However, the bottomed holes 62x and 62y may have an arbitrary shape, such as an oval shape, a polygonal shape, or the like. A depth of the bottomed holes 62x and 62y may be approximately one-half of the thickness of the second metal layer 62. A length $L_1$ of the interval between adjacent bottomed holes 62x may be approximately 100 μm to approximately 400 μm, for example. A length $L_2$ of the interval between adjacent bottomed holes 62y may be approximately 100 μm to approximately 400 μm, for example.

Inner walls of the bottomed holes 62x and 62y may have a tapered shape that widens from a bottom surface side towards an opening side. However, the inner walls of the bottomed holes 62x and 62y are not limited to such a tapered shape. For example, the inner walls of the bottomed holes 62x and 62y may be perpendicular with respect to the bottom surface. A width $W_3$ of the pore 62z along a lateral direction thereof may be approximately 10 μm to approximately 50 μm, for example. In addition, a width $W_4$ of the pore 62z along a longitudinal direction thereof may be approximately 50 μm to approximately 150 μm, for example.

As illustrated in FIG. 4 and FIG. 5B, the third metal layer 63 includes a plurality of bottomed holes 63x and a plurality of bottomed holes 63y. The bottomed holes 63x cave in from the upper surface of the third metal layer 63 to an approximate center part along the thickness direction thereof. The bottomed holes 63y cave in from the lower surface of the third metal layer 63 to the approximate center part along the thickness direction.

The third metal layer 63 includes first rows in which only the bottomed holes 63x are arranged along the X-direction, and second rows in which only the bottomed holes 63y are arranged along the Y-direction. The first rows and the second rows are alternately arranged along the Y-direction. Among the rows that are alternately arranged along the Y-direction, the bottomed holes 63x and the bottomed holes 63y of the adjacent rows partially overlap in the plan view, and the partially overlapping parts of the bottomed holes 63x and the bottomed holes 63y communicate with each other to form pores 63z.

However, center positions of the adjacent bottomed holes 63x and 63y that form the pore 63z are offset along the X-direction. In other words, the adjacent bottomed holes 63x and 63y that form the pores 63z are alternately arranged along a direction that is oblique with respect to both the X-direction and the Y-direction. The size, shape, or the like of the bottomed holes 63x and 63y, and the pores 63z may be similar to the size, shape, or the like of the bottomed holes 62x and 62y, and the pores 62z.

The bottomed holes 62y of the second metal layer 62 and the bottomed holes 63x of the third metal layer 63 are formed at overlapping positions in the plan view. For this reason, no pores are formed at an interface between the second metal layer 62 and the third metal layer 63.

As illustrated in FIG. 4 and FIG. 5C, the fourth metal layer 64 includes a plurality of bottomed holes 64x and a plurality of bottomed holes 64y. The bottomed holes 64x cave in from the upper surface of the fourth metal layer 64 to an approximate center part along the thickness direction thereof. The bottomed holes 64y cave in from the lower surface of the fourth metal layer 64 to the approximate center part along the thickness direction.

In the plan view, the bottomed holes 64x and the bottomed holes 64y are alternately arranged along the X-direction. In addition, in the plan view, the bottomed holes 64x and the bottomed holes 64y are alternately arranged along the Y-direction. The bottomed holes 64x and the bottomed holes 64y that are alternately arranged along the X-direction partially overlap in the plan view, and the partially overlapping parts of the bottomed holes 64x and the bottomed holes 64y communicate with each other to form pores 64z. The bottomed holes 64x and the bottomed holes 64y that are alternately arranged along the Y-direction are arranged at predetermined intervals, and do not overlap in the plan view. For this reason, the bottomed holes 64x and the bottomed holes 64y that are alternately arranged along the Y-direction do not form pores. The size, shape, or the like of the bottomed holes 64x and 64y, and the pores 64z may be similar to the size, shape, or the like of the bottomed holes 62x and 62y, and the pores 62z.

The bottomed holes 63y of the third metal layer 63 and the bottomed holes 64x of the fourth metal layer 64 are formed at overlapping positions in the plan view. For this reason, no pores are formed at an interface between the third metal layer 63 and the fourth metal layer 64.

As illustrated in FIG. 4 and FIG. 5D, the fifth metal layer 65 includes a plurality of bottomed holes 65x and a plurality of bottomed holes 65y. The bottomed holes 65x cave in from the upper surface of the fifth metal layer 65 to an approximate center part along the thickness direction thereof. The bottomed holes 65y cave in from the lower surface of the fifth metal layer 65 to the approximate center part along the thickness direction.

The fifth metal layer 65 includes first rows in which only the bottomed holes 65x are arranged along the X-direction, and second rows in which only the bottomed holes 65y are arranged along the Y-direction. The first rows and the second rows are alternately arranged along the Y-direction. Among the rows that are alternately arranged along the Y-direction, the bottomed holes 65x and the bottomed holes 65y of the adjacent rows partially overlap in the plan view, and the partially overlapping parts of the bottomed holes 65x and the bottomed holes 65y communicate with each other to form pores 65z.

However, center positions of the adjacent bottomed holes 65x and 65y that form the pore 65z are offset along the X-direction. In other words, the adjacent bottomed holes 65x and 65y that form the pores 65z are alternately arranged along a direction that is oblique with respect to both the X-direction and the Y-direction. The size, shape, or the like of the bottomed holes 65x and 65y, and the pores 65z may be similar to the size, shape, or the like of the bottomed holes 62x and 62y, and the pores 62z.

The bottomed holes 64y of the fourth metal layer 64 and the bottomed holes 65x of the fifth metal layer 65 are formed at overlapping positions in the plan view. For this reason, no pores are formed at an interface between the fourth metal layer 64 and the fifth metal layer 65.

The pores formed in each of the metal layers communicate with each other, and these mutually communicating pores spread three-dimensionally within the porous body 60. Hence, the working fluid C spreads three-dimensionally within these mutually communicating pores due to the capillary force.

The position inside the liquid pipe 40 where the porous body 60 is provided is not limited to a particular position. Preferably, the porous body 60 is provided at a position where a spacing is provided between the pipe wall of the liquid pipe 40 and the porous body 60. In this case, it is possible to form a micro flow passage 50 through which the working fluid C flows, between the pipe wall of the liquid pipe 40 and the porous body 60, on both sides of the porous body 60, to facilitate the flow of the working fluid C inside the liquid pipe 40.

Accordingly, the porous body 60 is provided inside the liquid pipe 40, and the porous body 60 extends along the liquid pipe 40 to a position in a vicinity of the evaporator 10. For this reason, the working fluid C in the liquid phase inside the liquid pipe 40 is guided to the evaporator 10 by the capillary force generated by the porous body 60.

As a result, even if heat leak or the like from the evaporator 10 may cause back-streaming of the vapor Cv inside the liquid pipe 40, the vapor Cv is pushed back by the capillary force from the porous body 60 acting on the working fluid C, to prevent the back-streaming of the vapor Cv from the evaporator 10 to the liquid pipe 40.

Further, the porous body 60 is also provided inside the evaporator 10. Hence, the working fluid C in the liquid phase permeates into the part of the porous body 60 inside the evaporator 10 and adjacent to the liquid pipe 40. In this state, the capillary force from the porous body 60, that acts on the working fluid C, becomes a pumping force that circulates the working fluid C inside the loop heat pipe 1.

Moreover, because this capillary force from the porous body 60 inside the evaporator 10 acts against the vapor Cv inside the evaporator 10, it is possible to reduce back-streaming of the vapor Cv from the evaporator 10 to the liquid pipe 40.

The inlet (not illustrated) is provided in the liquid pipe 40, and the working fluid C is filled into the liquid pipe 40 through the inlet. After filling the working fluid C into the liquid pipe 40, the inlet is sealed by the sealing member (not illustrated), to maintain the hermetically sealed state of the loop heat pipe 1.

[Method of Manufacturing Loop Heat Pipe in Second Embodiment]

Next, a method of manufacturing the loop heat pipe in the second embodiment will be described, by mainly referring to manufacturing stages of the porous body.

First, similarly to the manufacturing stage illustrated in FIG. 6A, a metal sheet 620 that is formed to the planar shape illustrated in FIG. 1 is prepared. Then, a resist layer 310 is formed on the upper surface of the metal sheet 620, and a resist layer 320 is formed on the lower surface of the metal sheet 620. The metal sheet 620 is a member that finally becomes the second metal layer 62. The metal sheet 620 may be made of copper, stainless steel, aluminum, magnesium alloy, or the like, for example. The thickness of the metal sheet 620 may be approximately 50 μm to approximately 200 μm, for example. For example, a photosensitive dry film resist or the like may be used for the resist layers 310 and 320.

Next, similarly to the manufacturing stage illustrated in FIG. 6B, the resist layer 310 is exposed and developed in regions (regions that become the evaporator 10 and the liquid pipe 40) on the metal sheet 620 where the porous body 60 is to be formed, to form openings 310x that selectively expose the upper surface of the metal sheet 620. In addition, the resist layer 320 is exposed and developed in a region on the metal sheet 620, to form openings 320x that selectively expose the lower surface of the metal sheet 620. The openings 310x and 320x are formed so that the shape and arrangement thereof correspond to the shape and arrangement of the bottomed holes 62x and 62y illustrated in FIG. 5A.

Next, similarly to the manufacturing stage illustrated in FIG. 6C, the metal sheet 620 exposed within the openings 310x is half-etched from the upper surface side of the metal sheet 620, and the metal sheet 620 exposed within the openings 320x is half-etched from the lower surface side of the metal sheet 620. As a result, the bottomed holes 62x are formed in the upper surface side of the metal sheet 620, and the bottomed holes 62y are formed in the lower surface side of the metal sheet 620. In addition, because the openings 310x and the openings 320x, that are alternately arranged along the X-direction on the respective surface sides of the metal sheet 620, partially overlap in the plan view, the partially overlapping parts communicate with each other to form the pores 62z. The half-etching of the metal sheet 620 may use a ferric chloride solution, for example.

Next, similarly to the manufacturing stage illustrated in FIG. 6D, the resist layers 310 and 320 are stripped using a stripping agent. Hence, the second metal layer 62 is completed.

Next, similarly to the manufacturing stage illustrated in FIG. 7A, the first and sixth (or outermost) metal layers 61 and 66, that are continuous layers having no holes or grooves, are prepared. In addition, the third, fourth, and fifth metal layers 63, 64, and 65 are formed by a method similar to the above described method of forming the second metal layer 62. The bottomed holes and the pores in the third, fourth, and fifth metal layers 63, 64, and 65 may be similar to the bottomed holes 62x and 62y and the pores 62z in the second metal layer 62 illustrated in FIG. 5.

Next, similarly to the manufacturing stage illustrated in FIG. 7B, the first through sixth metal layers 61 through 66 are stacked in the order illustrated in FIG. 7A, and are bonded by solid-phase bonding, such as solid-phase welding or the like, for example. The solid-phase bonding may include pressing and heating. As a result, the adjacent metal layers are directly bonded to each other, to complete the loop heat pipe 1 having the evaporator 10, the condenser 20, the vapor pipe 30, and the liquid pipe 40, in which the porous body 60 is formed inside the evaporator 10 and inside the liquid pipe 40. By providing the porous body 60 with the spacing from the pipe wall of the liquid pipe 40, the micro flow passage 50 through which the working fluid C flows, is formed between the pipe wall of the liquid pipe 40 and the porous body 60, on both sides of the porous body 60. Then, after a vacuum pump (not illustrated) or the like is used to exhaust or purge the inside of the liquid pipe 40, the working fluid C is filled into the liquid pipe 40 from the inlet (not illustrated), and the inlet is thereafter sealed.

Accordingly, by employing the structure in which the pores are formed in each metal layer by partially communicating the bottomed holes formed from both the upper and lower surfaces of each metal layer, this embodiment can eliminate the problems encountered by the conventional method of forming the pores, that stacks a plurality of metal layers formed with through-holes so that the through-holes of the plurality of metal layers partially overlap each other. In other words, according to this embodiment, a positional error is not generated when the plurality of metal layers are stacked, and a positional error is not generated due to expansion and contraction of the plurality of metal layers caused by a heat treatment when the plurality of metal layers are stacked. Thus, according to this embodiment, it is possible to form, in the plurality of metal layers, pores having a constant size.

Consequently, it is possible in this embodiment to prevent the capillary force generated by the pores from deteriorating, that is, decreasing, which would otherwise occur if the size of the pores were inconsistent. For this reason, this embodiment can stably obtain the effect of reducing the back-streaming of the vapor Cv from the evaporator 10 to the liquid pipe 40 by the capillary force generated by the pores.

In addition, at the part where the metal layers are stacked, this embodiment employs a structure in which the adjacent bottomed holes overlap in their entirety. For this reason, a bonding area of the stacked metal layers can be made large, to achieve a strong bonding of the stacked metal layers.

The porous body inside the liquid pipe may be modified similarly to the first modification of the first embodiment, the second modification of the first embodiment, and the third modification of the first embodiment described above.

In addition, the porous body may be provided inside only the liquid pipe and not inside the evaporator.

First Modification of Second Embodiment

In a first modification of the second embodiment, the porous body 60 provided inside the liquid pipe 40 may be modified to a shape similar to the shape of the porous body 60A illustrated in FIG. 8, FIG. 9A, and FIG. 9B. A description of the structure illustrated in FIG. 8, FIG. 9A, and FIG. 9B will be omitted, because this structure is similar to the structure of the first modification of the first embodiment described above.

Second Modification of Second Embodiment

In a second modification of the second embodiment, the porous body 60 provided inside the liquid pipe 40 may be modified to a shape similar to the shape of the porous body 70 illustrated in FIG. 10, FIG. 11A through FIG. 11D, and FIG. 12A through FIG. 12C. A description of the structure illustrated in FIG. 10, FIG. 11A through FIG. 11D, and FIG. 12A through FIG. 12C will be omitted, because this structure is similar to the structure of the second modification of the first embodiment described above.

Third Modification of Second Embodiment

In a third modification of the second embodiment, the porous body 60 provided inside the liquid pipe 40 may be modified to a shape similar to the shape of the porous body 70A illustrated in FIG. 13, FIG. 14A, and FIG. 14B. A description of the structure illustrated in FIG. 13, FIG. 14A, and FIG. 14B will be omitted, because this structure is similar to the structure of the third modification of the first embodiment described above.

Next, a further modification, that is applicable with respect to each of the porous body 60 in the first embodiment, the porous bodies 60A, 70, and 70A in the first, second, and third modifications of the first embodiment, the porous body 60 in the second embodiment, and the porous bodies 60A, 70, and 70A in the first, second, and third modifications of the second embodiment, will be described.

Further Modification

In the further modification, the bottomed holes have cross sectional shapes different from the cross sectional shapes described above. Constituent elements of the loop heat pipe in the further modification, that are the same as those corresponding constituent elements of the embodiments and modifications described above, are designated by the same reference numerals, and a description thereof may be omitted.

Figure 17A:
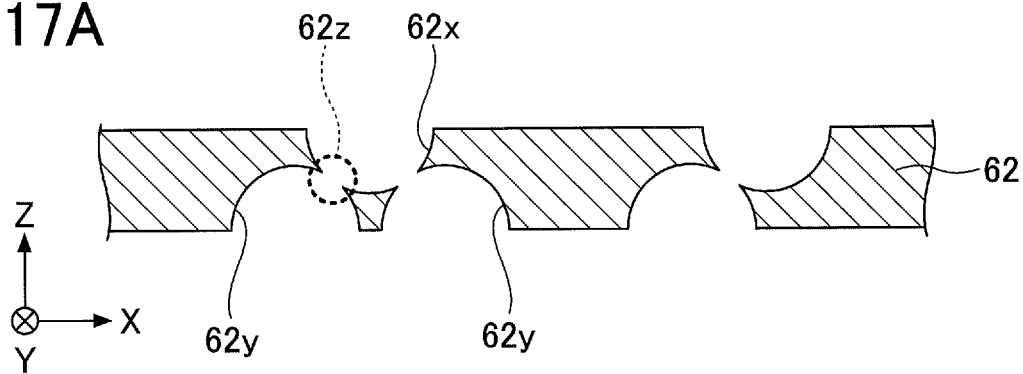
FIG. 17A, FIG. 17B, and FIG. 17C are diagrams illustrating examples of shapes of bottomed holes provided in a metal layer.
Figure 17B:
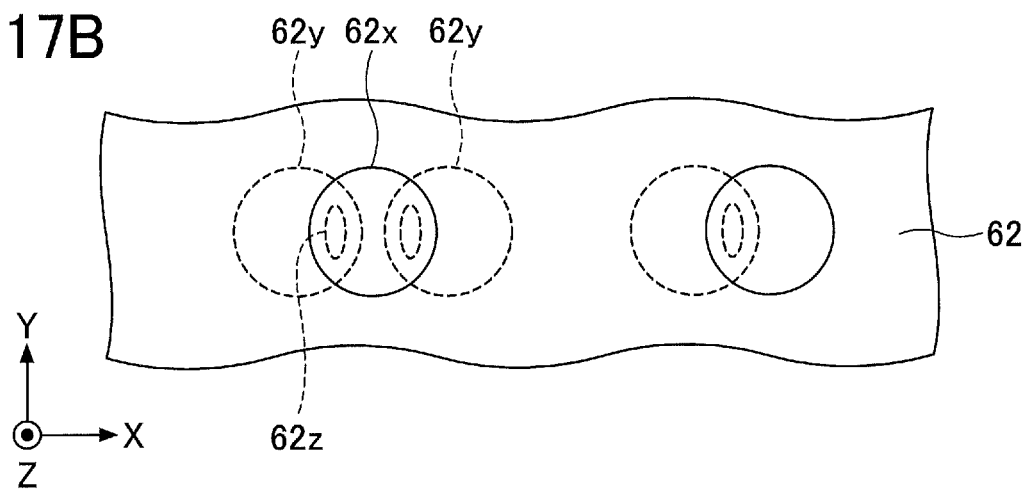
Figure 17C:
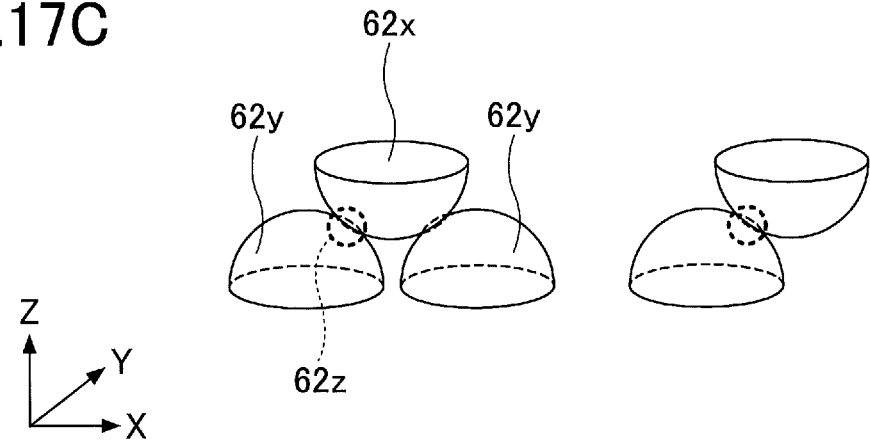

FIG. 17A, FIG. 17B, and FIG. 17C are diagrams illustrating examples of shapes of bottomed holes provided in a metal layer. FIG. 17A illustrates a cross sectional view, FIG. 17B illustrate a plan view, and FIG. 17C illustrates a perspective view of only the bottomed holes. As illustrated in FIG. 17A through FIG. 17C, the bottomed holes 62$x$ and 62$y$ in the second metal layer 62 may have an inner wall surface having a concave shape formed by a curved surface.

Examples of the concave shape of the inner wall surface of the bottomed holes 62$x$ and 62$y$, formed by the curved surface, include concave shapes having a cross sectional shape that is an approximate semi-circular shape, an approximate semi-oval shape, or the like, for example. The approximate semi-circular shape not only includes a half-circle shape obtained by bisecting a perfect circle into two equal halves, but may also include a semi-circular shape with a circular arc longer or shorter than that of the half-circle shape. In addition, the approximate semi-oval shape not only includes a half-oval shape obtained by bisecting an oval into two equal halves, but may also include a semi-oval shape with a circular arc longer or shorter than that of the half-oval shape.

Figure 18:
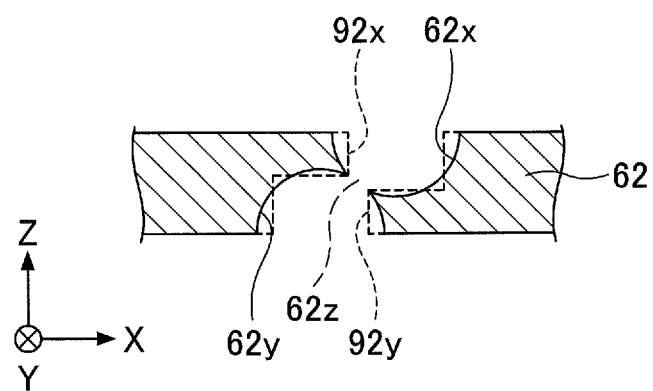
FIG. 18 is a diagram for explaining effect of forming the bottomed hole to a concave shape having an inner wall surface that is a curved surface.

As the diameter of the pores formed by the overlapping bottomed holes on the two sides (that is, the bottomed holes formed in the upper surface of the lower one of two adjacent metal layers and the bottomed holes formed in the lower surface of the upper one of the two adjacent metal layers, that overlap) becomes large, the capillary force that draws in the working fluid decreases, to deteriorate the fluid flow. Hence, the diameter of the pores formed by the overlapping bottomed holes on the two sides is preferably small. When the concave shape of the inner wall surface of the bottomed holes is formed by the curved surface, it is possible to increase a volume of the bottomed holes compared to bottomed holes 92$x$ and 92$y$ having a vertical inner wall surface indicated by a dotted line in FIG. 18, while maintaining the small diameter of the pores formed by the overlapping bottomed holes on the two sides, as may be seen from FIG. 18. As a result, a spatial volume of the bottomed holes themselves becomes large and a high porosity can be obtained, to reduce the pressure drop or pressure loss inside the porous body.

Figure 19A:
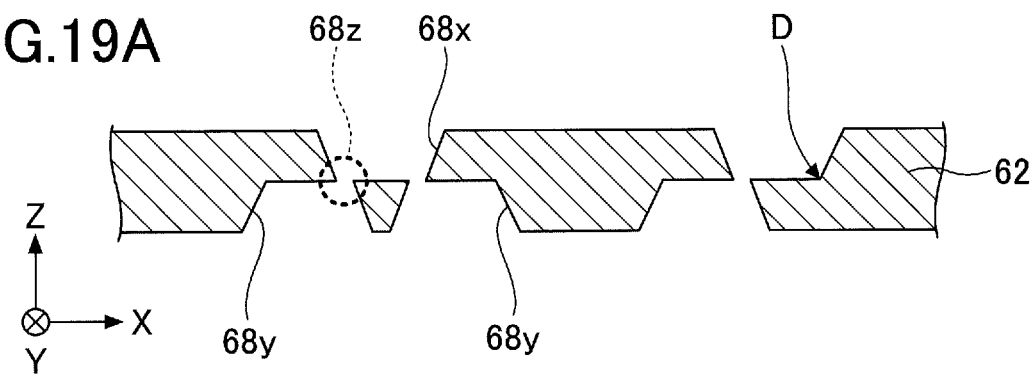
FIG. 19A, FIG. 19B, and FIG. 19C are diagrams for explaining problems of the bottomed holes having corner parts.
Figure 19B:
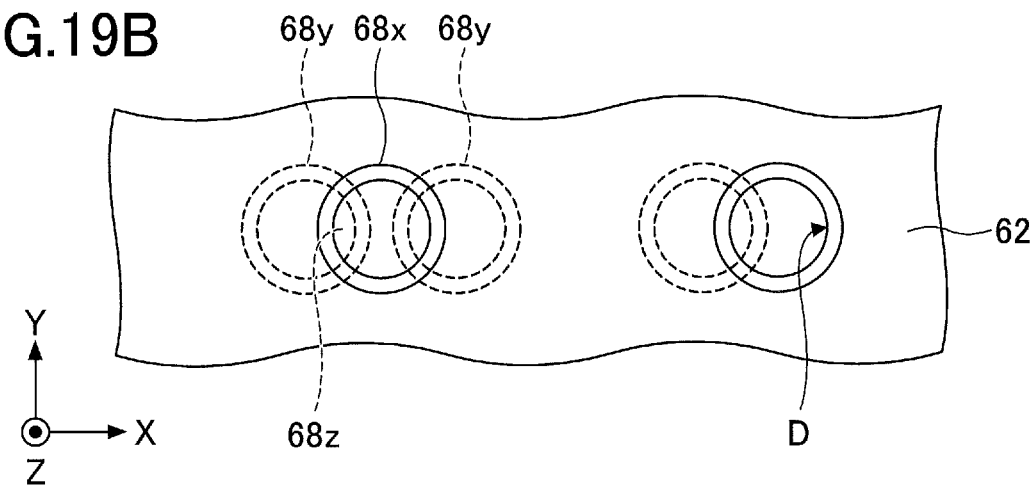
Figure 19C:
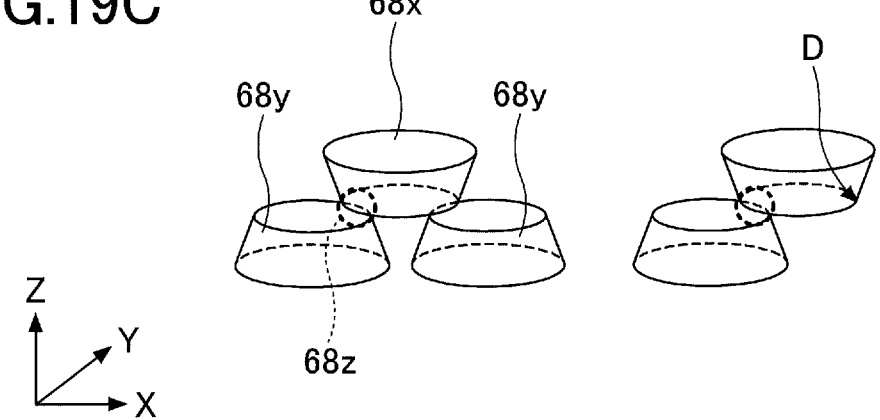

FIG. 19A, FIG. 19B, and FIG. 19C are diagrams for explaining problems of the bottomed holes having corner parts. FIG. 19A illustrates a cross sectional view, FIG. 19B illustrate a plan view, and FIG. 19C illustrates a perspective view of only the bottomed holes.

In addition, in a case in which pores 68$z$ are provided by forming bottomed holes 68$x$ and 68$y$ of the second metal layer 62 to the tapered cross sectional shape having rectangular or corner parts as illustrated in FIG. 19A, FIG. 19B, and FIG. 19C, the working fluid C builds up at a corner part D where bottom and side surfaces of the bottomed holes 68$x$ and 68$y$ meet, to deteriorate the fluid flow. However, when the bottomed holes 62$x$ and 62$y$ of the second metal layer 62 are formed to the concave cross sectional shape by forming the inner wall surface of the bottomed holes 62$x$ and 62$y$ by the curved surface as illustrated in FIG. 17A, FIG. 17B, and FIG. 17C, the pores 62$z$ formed by the bottomed holes 62$x$ and 62$y$ will not have rectangular or corner parts, to improve fluid flow.

Figure 20:
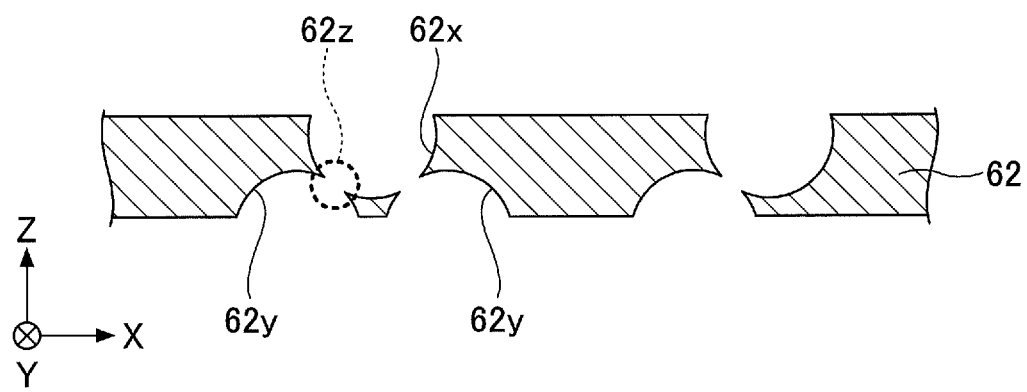
FIG. 20 is a diagram illustrating an example in which depths of the bottomed holes provided in one metal layer are varied.

The depth of the bottomed holes 62$x$ and the depth of the bottomed holes 62$y$ do not necessarily have to be the same. For example, as illustrated in FIG. 20, the depth of the bottomed holes 62$x$ may be larger than the depth of the bottomed holes 62$y$. In this case, the fluid flow may be made non-uniform by making the bottomed holes 62$y$ in the lower surface of the second metal layer 62, where the working fluid C more easily builds up due to the weight thereof, shallower than the bottomed holes 62$x$ in the upper surface of the second metal layer 62. The non-uniform fluid flow, generated by making the bottomed holes 62$y$ shallower than the bottomed holes 62$x$, promotes the fluid movement caused by the capillary force, to prevent the fluid flow from coming to a complete stop. For this reason, it is possible to provide stable and improved heat release. But if necessary, the depth of the bottomed holes 62$y$ may be made larger than the depth of the bottomed holes 62$x$.

The further modification is described above by taking the second metal layer 62 as an example. However, the structure of each of the third through fifth metal layers 63 through 65 may be similar to the structure of the second metal layer 62 described above in conjunction with FIG. 17A through FIG. 17C, FIG. 18, and FIG. 20.

Next, further embodiments, that are applicable with respect to each of the porous body 60 in the first embodiment, the porous bodies 60A, 70, and 70A in the first, second, and third modifications of the first embodiment, the porous body 60 in the second embodiment, the porous bodies 60A, 70, and 70A in the first, second, and third modifications of the second embodiment, and the porous body in the further modification will be described.

Further Embodiment 1

In a further embodiment 1, the example of the porous body includes bottomed holes having different sizes. Constituent elements in the further embodiment 1, that are the same as those corresponding constituent elements of the embodiments and modifications described above, are designated by the same reference numerals, and a description thereof may be omitted.

Figure 21:
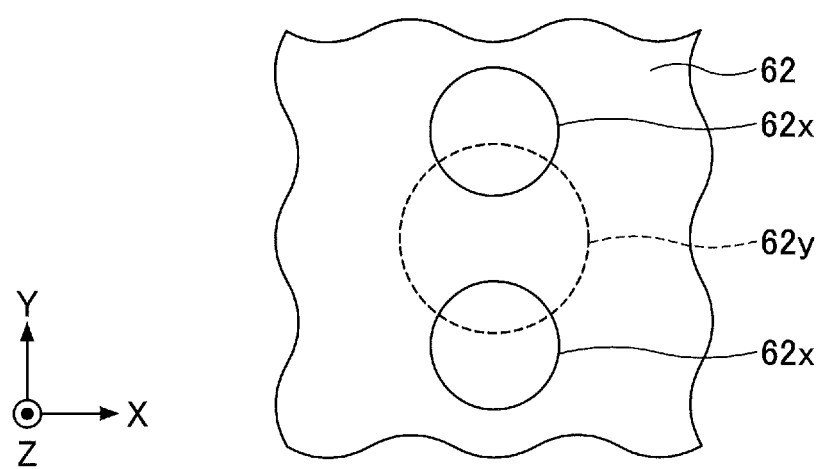
FIG. 21 is a diagram illustrating an example in which sizes of the bottomed holes provided in one metal layer are varied.

FIG. 21 is a diagram illustrating an example in which sizes of the bottomed holes provided in one metal layer are varied. As illustrated in FIG. 21, the size of the bottomed holes 62y in the second metal layer 62 may be larger than the size of the bottomed holes 62x in the second metal layer 62. Alternatively, the size of the bottomed holes 62x in the second metal layer 62 may be larger than the size of the bottomed holes 62y in the second metal layer 62. In addition, between 2 adjacent metal layers, the size of the bottomed holes in one of the 2 adjacent metal layers may be different from the size of the bottomed holes in the other of the 2 adjacent metal layers. For example, the size of the bottomed holes 62y in the second metal layer 62 may be different from the size of the bottomed holes 63x in the third metal layer 63.

The size of the pores can be varied by varying the size of the vertically adjacent bottomed holes. For this reason, it is possible to adjust the capillary force of the porous body 60 acting on the working fluid C. Further, the volume of the space can be increased by enlarging the size of a part of the bottomed holes, to reduce the pressure drop or pressure loss of the working fluid C flowing inside the bottomed holes.

Further Embodiment 2

In a further embodiment 2, the examples of the porous body inside the evaporator and the porous body inside the liquid pipe include bottomed holes having different sizes. Constituent elements in the further embodiment 2, that are the same as those corresponding constituent elements of the embodiments and modifications described above, are designated by the same reference numerals, and a description thereof may be omitted.

Figure 22A:
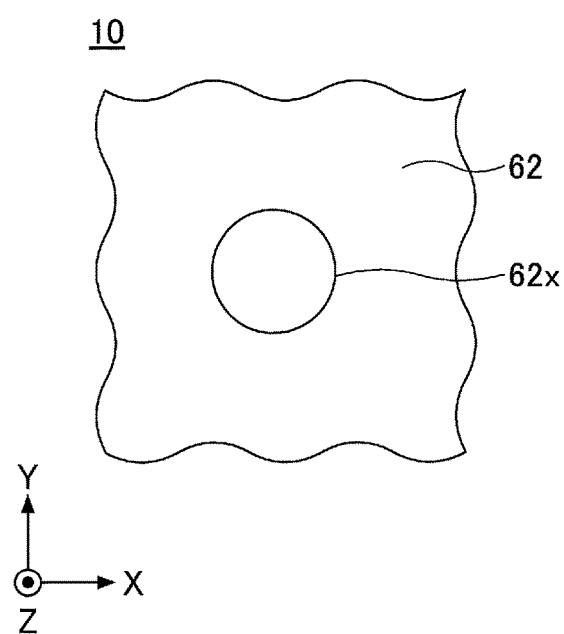
FIG. 22A and FIG. 22B are diagrams illustrating examples in which the bottomed holes provided in the porous body inside the evaporator and the porous body inside a liquid pipe have different sizes.
Figure 22B:
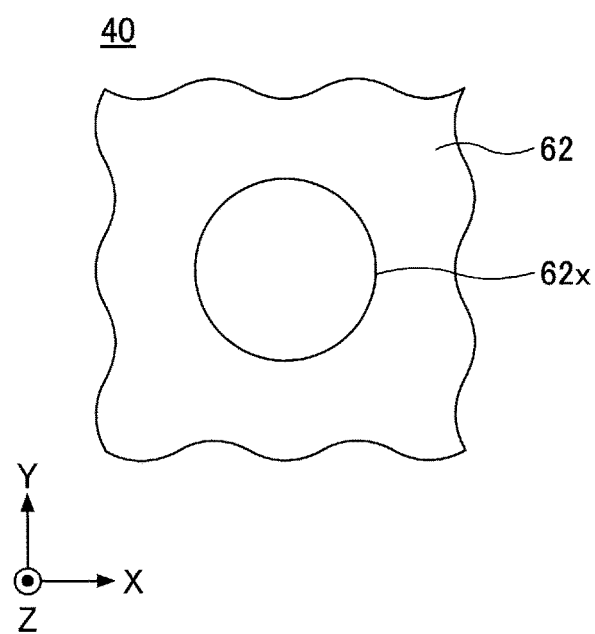

FIG. 22A and FIG. 22B are diagrams illustrating examples in which the bottomed holes provided in the porous body inside the evaporator and the porous body inside a liquid pipe have different sizes. In this example, the size of the bottomed holes 62x in the second metal layer 62 of the porous body provided inside the evaporator 10 illustrated in FIG. 22A is different from the size of the bottomed holes 62x in the second metal layer 62 of the porous body provided inside the liquid pipe 40 illustrated in FIG. 22B.

For example, the size of the bottomed holes 62x in the second metal layer 62 of the porous body provided inside the evaporator 10 may be smaller than the size of the bottomed holes 62x in the second metal layer 62 of the porous body provided inside the liquid pipe 40. In this case, the working fluid C flows smoothly within the larger bottomed holes 62x inside the liquid pipe 40, to quickly move the working fluid C to the evaporator 10. Moreover, inside the evaporator 10, the working fluid C in the liquid phase acts as a check valve, due to the capillary force from the smaller bottomed holes 62x acting on the working fluid C, to thereby effective reduce back-streaming of the vapor Cv.

Further Embodiment 3

In a further embodiment 3, the example of the porous body includes a plurality of pores provided with respect to one bottomed hole. Constituent elements in the further embodiment 3, that are the same as those corresponding constituent elements of the embodiments and modifications described above, are designated by the same reference numerals, and a description thereof may be omitted.

Figure 23:
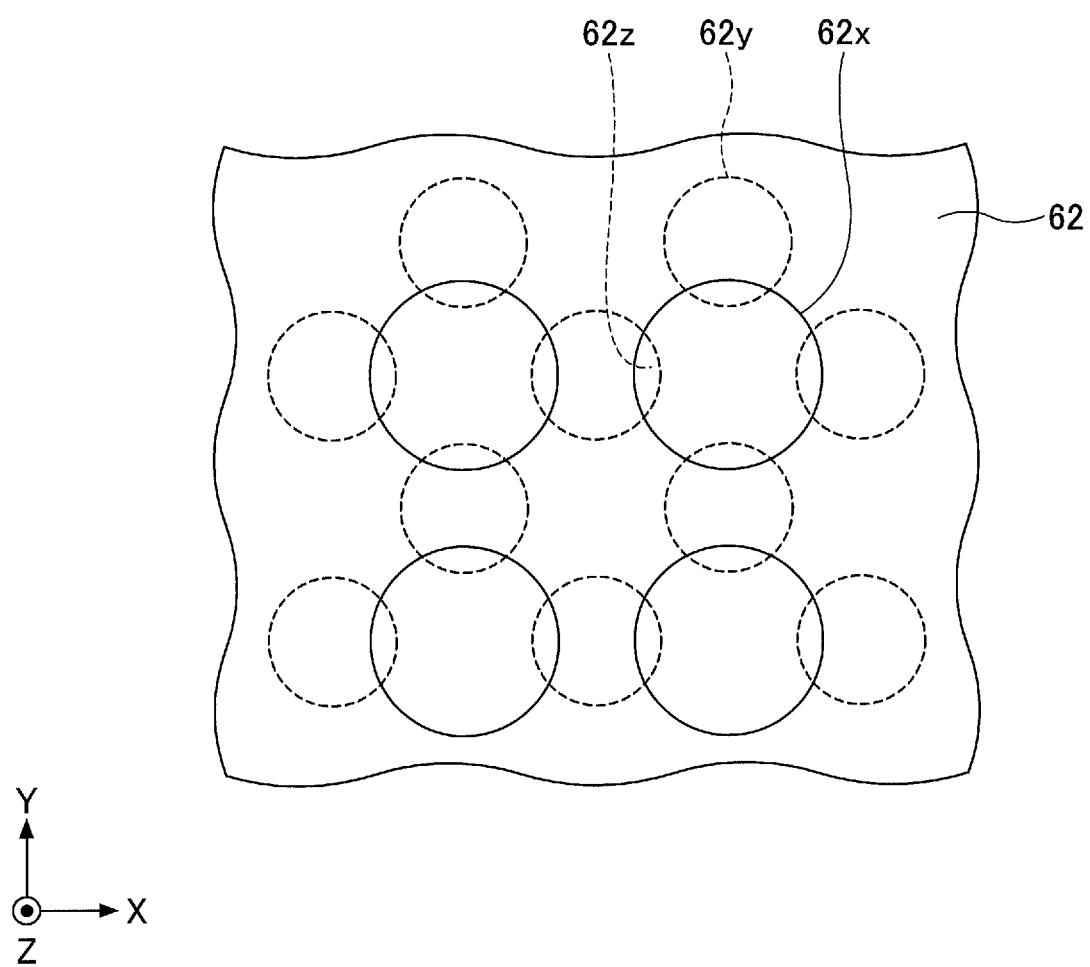
FIG. 23 is a diagram illustrating an example in which a plurality of pores are provided with respect to one bottomed hole.

FIG. 23 is a diagram illustrating an example in which the plurality of pores are provided with respect to one bottomed hole. As illustrated in FIG. 23, for example, the size of the bottomed holes 62x in the second metal layer 62 may be larger than the size of the bottomed holes 62y in the second metal layer, and the plurality of bottomed holes 62y may be arranged in a periphery of each bottomed hole 62x. In this case, the bottomed hole 62x and each of the plurality of bottomed holes 62y arranged in the periphery of this bottomed hole 62x partially overlap in the plan view, so that a plurality of pores 62z are formed with respect to one bottomed hole 62x.

By forming the plurality of pores with respect to one bottomed hole, the pores communicate with each other even within a single metal layer. As a result, the working fluid C can easily spread within the pores that communicate with each other, due to the capillary force. In addition, by enlarging the size of a part of the bottomed holes, a spatial volume becomes large, to reduce the pressure drop or pressure loss of the working fluid C flowing inside the bottomed holes.

The structures of the third, fourth, and fifth metal layers 63, 64, and 65 may be similar to the structure of the second metal layer 62 described above in conjunction with FIG. 21, FIG. 22A, FIG. 22B, and FIG. 23.

Further Embodiment 4

In a further embodiment 4, the example of the porous body includes grooves in place of the bottomed holes. Constituent elements in the further embodiment 4, that are the same as those corresponding constituent elements of the embodiments and modifications described above, are designated by the same reference numerals, and a description thereof may be omitted.

Figure 24:
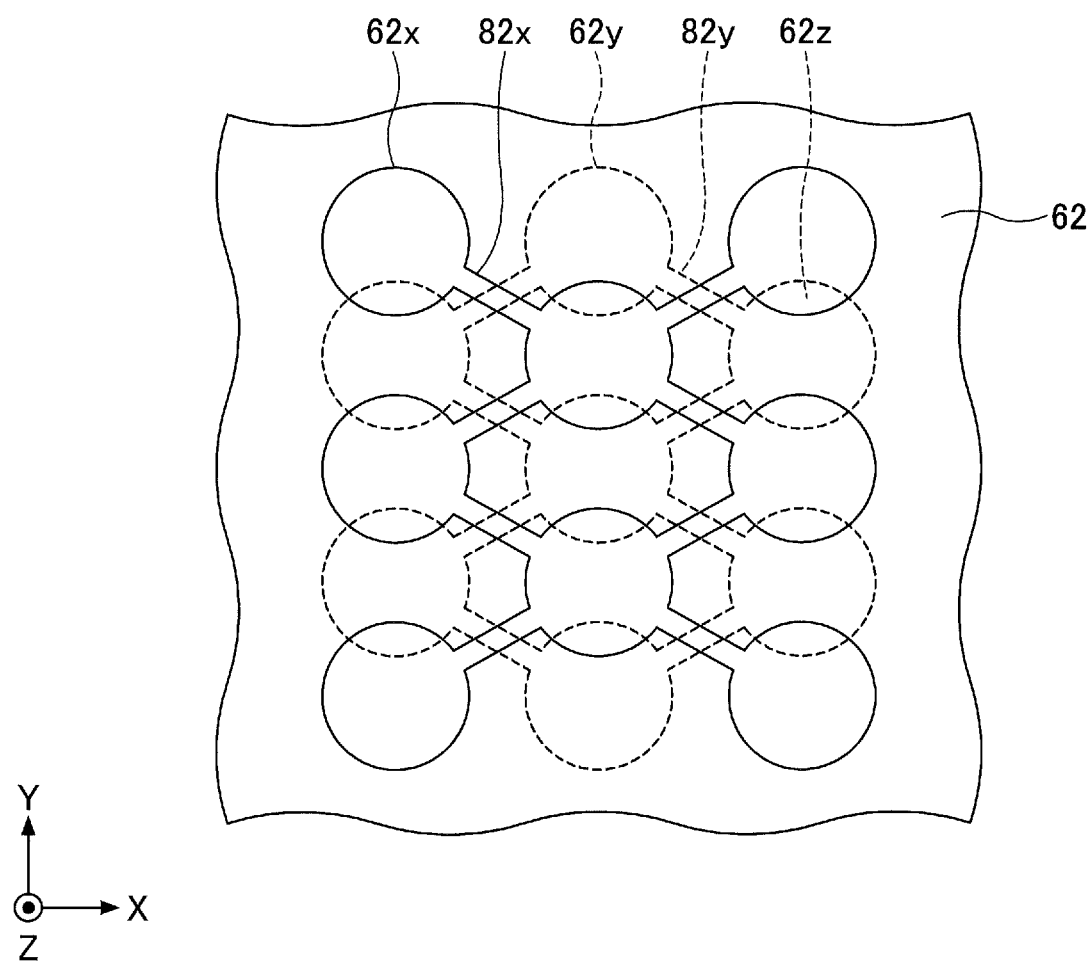
FIG. 24 is a diagram illustrating an example in which bottomed holes and grooves are provided in one metal layer.

FIG. 24 is a diagram illustrating an example in which bottomed holes and grooves are provided in one metal layer. As illustrated in FIG. 24, for example, the second metal layer 62 may include a plurality of grooves 82x and a plurality of grooves 82y. The grooves 82x cave in from the upper surface of the second metal layer 62 to an approximate center part along the thickness direction thereof. The groove 82y cave in from the lower surface of the second metal layer 62 to the approximate center part along the thickness direction. Further, in FIG. 24, one groove 82x communicate 2 adjacent bottomed grooves 62x, and one groove 82y communicate 2 adjacent bottomed grooves 62y. The grooves 82x and 82y may be formed by half-etching, similarly as in the case of forming the bottomed grooves 62x and 62y. The groove 82x does not communicate to the groove 82y.

By communicating 2 adjacent bottomed holes by the groove, it is possible to the permeability of the working fluid C into the porous body. The effect of improving the permeability of the working fluid C into the porous body can be obtained to a certain extent, even if only the grooves 82x are provided, or only the grooves 82y are provided.

The structures of the third, fourth, and fifth metal layers 63, 64, and 65 may be similar to the structure of the second metal layer 62 described above in conjunction with FIG. 24.

Various aspects of the subject-matter described herein may be set out non-exhaustively in the following numbered clauses:

1. A method of manufacturing a loop heat pipe, comprising:
   forming an evaporator configured to vaporize a working fluid, a condenser configured to liquefy the working fluid, a liquid pipe configured to connect the evaporator and the condenser, and a vapor pipe configured to connect the evaporator and the condenser, to form a loop-shaped passage together with the liquid pipe; and
   forming a porous body inside a flow passage in which the working fluid or vapor of the working fluid that is vaporized flows,
   wherein the forming the porous body includes forming a first metal layer that forms the porous body, and
   wherein the forming the first metal layer includes
   forming a first bottomed hole by half-etching from a first surface of a first metal sheet, and
   forming a second bottomed hole by half-etching from a second surface of the first metal sheet, opposite to the first surface, so that the second bottomed hole partially communicates with the first bottomed hole, to form a pore,
   wherein an inner wall surface of each of the first and second bottomed holes formed in the porous body is formed to a concave shape formed by a curved surface.

2. The method of manufacturing the loop heat pipe according to clause 1, wherein
   the forming the porous body further includes forming a second metal layer adjacent to the first metal layer, and
   the forming the second metal layer includes
   forming a first bottomed hole by half-etching from a first surface of a second metal sheet, and
   forming a second bottomed hole by half-etching from a second surface of the second metal sheet, opposite to the first surface of the second metal sheet, so that the second bottomed hole in the second metal sheet partially communicates with the first bottomed hole in the second metal sheet, to form a pore,
   wherein the second bottomed hole in the first metal layer and the first bottomed hole in the second metal layer partially communicate with each other to form a pore.

3. The method of manufacturing the loop heat pipe according to clause 1, wherein
   the forming the porous body further includes forming a second metal layer adjacent to the first metal layer, and
   the forming the second metal layer includes
   forming a first bottomed hole by half-etching from a first surface of a second metal sheet, and
   forming a second bottomed hole by half-etching from a second surface of the second metal sheet, opposite to the first surface of the second metal sheet, so that the second bottomed hole in the second metal sheet partially communicates with the first bottomed hole in the second metal sheet, to form a pore,
   wherein the second bottomed hole in the first metal layer and the first bottomed hole in the second metal layer are formed at overlapping positions in a plan view.

4. The method of manufacturing the loop heat pipe according to any of clauses 1 to 3, wherein
   the forming the porous body further includes forming a first outermost metal layer stacked on the first surface of the first metal layer,
   the forming the first outermost metal layer includes forming a third bottomed hole by half-etching from a surface of the first outermost metal layer contacting the first surface of the first metal layer, and
   the third bottomed hole partially communicates with the first bottomed hole in the first metal layer to form a pore.

5. The method of manufacturing the loop heat pipe according to clause 4, wherein
   the forming the porous body further includes forming a second outermost metal layer,
   the forming the second outermost metal layer includes forming a fourth bottomed hole by half-etching from a surface of the second outermost metal layer contacting an adjacent metal layer of the porous body, and
   the fourth bottomed hole partially communicates with a bottomed hole that caves in from a surface of the adjacent metal layer, contacting the surface of the second outermost metal layer, to form a pore.

6. The method of manufacturing the loop heat pipe according to any of clauses 1 to 5, further comprising:
   forming a porous body inside the liquid pipe.

7. The method of manufacturing the loop heat pipe according to any of clauses 1 to 6, further comprising:
   forming a porous body inside the evaporator.

8. The method of manufacturing the loop heat pipe according to any of clauses 1 to 7, wherein the forming the first metal layer forms one of the first bottomed hole and the second bottomed hole deeper than the other of the first bottomed hole and the second bottomed hole.

According to each of the embodiments and modifications described above, it is possible to provide a loop heat pipe having a porous body that can improve, that is, increase, a capillary force generated by pores of the porous body, and to provide a method of manufacturing such a loop heat pipe.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

Although the embodiments and modifications are numbered with, for example, "first," "second," or "third," the ordinal numbers do not imply priorities of the embodiments and modifications. The present invention is not limited to these embodiments and modifications, and many other variations and modifications may be made without departing from the scope of the present invention, as will be apparent to those skilled in the art.

For example, the arrangement of the bottomed holes is not limited to the arrangements in the plan view described above, and various variations and modifications may be made to the arrangement of the bottomed holes.

In addition, the protruding part or protruding parts of the porous body need not be formed on all of the metal layers, excluding the outermost layers among the stacked metal layers. For example, in the case in which 6 metal layers are stacked, the protruding part or protruding parts may be formed on only the third metal layer and the fifth metal layer, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
   an evaporator configured to vaporize a working fluid;
   a condenser configured to liquefy the working fluid;
   a liquid pipe configured to connect the evaporator and the condenser;
   a porous body provided inside a flow passage in which the working fluid or vapor of the working fluid that is vaporized flows; and
   a vapor pipe configured to connect the evaporator and the condenser, to form a loop-shaped passage together with the liquid pipe,
   wherein the porous body includes a first metal layer,
   wherein the first metal layer includes
      a first bottomed hole that caves in from a top surface of the first metal layer but does not extend through the entire first metal layer,
      a second bottomed hole that caves in from a bottom surface of the first metal layer but does not extend through the entire first metal layer, and
      a pore formed by the first bottomed hole and the second bottomed hole and communicating the first bottomed hole and the second bottomed hole at a portion where the first bottomed hole and the second bottomed hole overlap in a plan view of the loop heat pipe viewed in a direction perpendicular to the top or bottom surface of the first metal layer, and
   wherein the first and second bottomed holes are tapered in mutually opposite directions, and an inner wall surface of each of the first and second bottomed holes formed in the porous body has a concave shape formed by a curved surface.

2. The loop heat pipe as claimed in claim 1, wherein the first bottomed hole is deeper or shallower than the second bottomed hole.

3. The loop heat pipe as claimed in claim 1, wherein the porous body is provided inside the liquid pipe.

4. The loop heat pipe as claimed in claim 3, wherein the porous body provided inside the liquid pipe is a column support provided at a center part inside the liquid pipe.

5. The loop heat pipe as claimed in claim 1, wherein the porous body is provided inside the evaporator.

6. The loop heat pipe as claimed in claim 1, wherein the porous body further includes
   a second metal layer adjacent to the first metal layer,
   wherein the second metal layer includes
      a first bottomed hole that caves in from a top surface of the second metal layer but does not extend through the entire second metal laver,
      a second bottomed hole that caves in from a bottom surface of the second metal layer but does not extend through the entire second metal layer, and
      a pore formed by the first bottomed hole and the second bottomed hole in the second metal layer and communicating the first bottomed hole and the second bottomed hole in the second metal layer at a portion where the first bottomed hole and the second bottomed hole in the second metal layer overlap in the plan view, and
   wherein the second bottomed hole in the first metal layer and the first bottomed hole in the second metal layer communicate with each other to form a pore.

7. The loop heat pipe as claimed in claim 1, wherein the porous body further includes
   a second metal layer adjacent to the first metal layer,
   wherein the second metal layer includes
      a first bottomed hole that caves in from a top surface of the second metal layer but does not extend through the entire second metal laver,
      a second bottomed hole that caves in from a bottom surface of the second metal layer but does not extend through the entire second metal layer, and
      a pore formed by the first bottomed hole and the second bottomed hole in the second metal layer and communicating the first bottomed hole and the second bottomed hole in the second metal layer at a portion where the first bottomed hole and the second bottomed hole in the second metal layer overlap in the plan view, and
   wherein the second bottomed hole in the first metal layer and the first bottomed hole in the second metal layer are arranged at overlapping positions in the plan view.

8. The loop heat pipe as claimed in claim 1, wherein
   the porous body further includes a first outermost metal layer stacked on the top surface of the first metal layer,
   the first outermost metal layer includes a third bottomed hole that caves in from a bottom surface of the first outermost metal layer, contacting the top surface of the first metal layer, but does not extend through the entire first outermost metal layer, and
   the third bottomed hole communicates with the first bottomed hole in the first metal layer to form a pore.

9. The loop heat pipe as claimed in claim 8, wherein
   the porous body further includes a second outermost metal layer,
   the second outermost metal layer includes a fourth bottomed hole that caves in from a top surface of the second outermost metal layer, contacting an adjacent metal layer of the porous body, but does not extend through the entire second outermost metal layer, and
   the fourth bottomed hole communicates with a bottomed hole that caves in from a bottom surface of the adjacent metal layer, contacting the top surface of the second outermost metal layer, to forma pore.

* * * * *